US012628317B2

(12) United States Patent
Salmon

(10) Patent No.: US 12,628,317 B2
(45) Date of Patent: May 12, 2026

(54) ZETTASCALE SUPERCOMPUTER

(71) Applicant: Peter C. Salmon, Mountain View, CA (US)

(72) Inventor: Peter C. Salmon, Mountain View, CA (US)

( * ) Notice: Subject to any disclaimer, the term of this patent is extended or adjusted under 35 U.S.C. 154(b) by 0 days.

(21) Appl. No.: 18/231,179

(22) Filed: Aug. 7, 2023

(65) Prior Publication Data

US 2024/0164064 A1     May 16, 2024

Related U.S. Application Data

(60) Provisional application No. 63/399,171, filed on Aug. 18, 2022.

(51) Int. Cl.
| | |
|---|---|
| *H05K 7/20* | (2006.01) |
| *G06F 1/26* | (2006.01) |
| *H05K 5/06* | (2006.01) |

(52) U.S. Cl.
CPC ........... *H05K 7/20772* (2013.01); *G06F 1/26* (2013.01); *H05K 5/065* (2013.01); *H05K 7/20236* (2013.01)

(58) Field of Classification Search
None
See application file for complete search history.

(56) References Cited

U.S. PATENT DOCUMENTS

| | | |
|---|---|---|
| 4,114,275 A | 9/1978 | Jones et al. |
| 4,124,338 A | 11/1978 | Mitchell |

| | | |
|---|---|---|
| 4,169,262 A | 9/1979 | Schwartz et al. |
| 4,259,676 A | 3/1981 | Salmon |
| 4,309,365 A | 1/1982 | Van Ness et al. |
| 4,341,518 A | 7/1982 | Wallace |
| 4,366,802 A | 1/1983 | Goodine et al. |
| 4,419,300 A | 12/1983 | Van Ness et al. |
| 4,534,803 A | 8/1985 | Asano et al. |
| 4,551,787 A | 11/1985 | Mittal et al. |
| 4,585,293 A | 4/1986 | Czeschka et al. |
| 4,669,529 A | 6/1987 | Evertz |
| 4,677,528 A | 6/1987 | Miniet |
| 4,733,256 A | 3/1988 | Salmon |
| 4,765,400 A | 8/1988 | Chu et al. |
| 4,777,500 A | 10/1988 | Salmon |
| RE32,897 E | 3/1989 | Salmon |
| 4,928,207 A | 5/1990 | Chrysler et al. |

(Continued)

OTHER PUBLICATIONS

Birbarah et al., Water Immersion Cooling of High Power Density Electronics, International Journal of Heat and Mass Transfer, 2020, vol. 147, 13 pages.

(Continued)

*Primary Examiner* — Courtney L Smith
(74) *Attorney, Agent, or Firm* — Jennifer Hayes; Nixon Peabody LLP

(57)     ABSTRACT

A zettascale supercomputer may be configured using an array of servers organized in computer pods comprising 4-60 servers per pod. Each server includes computer modules immersed in a tank in which cooling water is flowing. Copper bus bars deliver power to each pod in a range of 4-180 MW. Cooling water is delivered to each pod in a range of 200-24,000 gallons per minute. Supercomputers having an operating power in a range of 4 MW-10 GW are described.

17 Claims, 18 Drawing Sheets

(56) References Cited

U.S. PATENT DOCUMENTS

| | | | |
|---|---|---|---|
| 4,973,247 A | 11/1990 | Varnes et al. | |
| 4,975,058 A | 12/1990 | Woodward | |
| 4,978,548 A | 12/1990 | Cope et al. | |
| 4,993,229 A | 2/1991 | Baus et al. | |
| 5,028,988 A | 7/1991 | Porter et al. | |
| 5,030,976 A | 7/1991 | Salmon | |
| 5,074,787 A | 12/1991 | Tsukada | |
| 5,088,924 A | 2/1992 | Woodward | |
| 5,145,370 A | 9/1992 | Woodward | |
| 5,153,617 A | 10/1992 | Salmon | |
| 5,155,661 A | 10/1992 | Nagesh et al. | |
| 5,214,570 A | 5/1993 | Shah et al. | |
| 5,283,446 A | 2/1994 | Tanisawa | |
| 5,287,127 A | 2/1994 | Salmon | |
| 5,323,292 A | 6/1994 | Brzezinski | |
| 5,400,062 A | 3/1995 | Salmon | |
| 5,465,192 A | 11/1995 | Yoshikawa | |
| 5,476,572 A | 12/1995 | Prough | |
| 5,478,778 A | 12/1995 | Tanisawa | |
| 5,501,077 A | 3/1996 | Davis et al. | |
| 5,514,906 A | 5/1996 | Love et al. | |
| 5,555,579 A | 9/1996 | Wu et al. | |
| 5,700,355 A | 12/1997 | Prough | |
| 5,717,608 A | 2/1998 | Jensen | |
| 5,778,677 A | 7/1998 | Hung et al. | |
| 5,800,170 A | 9/1998 | Tsukada | |
| 5,859,763 A | 1/1999 | Nam et al. | |
| 5,897,610 A | 4/1999 | Jensen | |
| 5,968,314 A | 10/1999 | Prough | |
| 6,055,157 A | 4/2000 | Bartilson | |
| 6,126,099 A | 10/2000 | Fachinger et al. | |
| 6,126,883 A | 10/2000 | Troetscher et al. | |
| 6,210,262 B1 | 4/2001 | Burch et al. | |
| 6,251,466 B1 | 6/2001 | Mcguire et al. | |
| 6,309,049 B1 | 10/2001 | Salmon | |
| 6,404,640 B1 | 6/2002 | Ishimine et al. | |
| 6,452,789 B1 | 9/2002 | Pallotti et al. | |
| 6,467,679 B2 | 10/2002 | Kyomasu et al. | |
| 6,491,202 B1 | 12/2002 | Kyomasu et al. | |
| 6,528,878 B1 | 3/2003 | Daikoku et al. | |
| 6,601,295 B2 | 8/2003 | Maekawa | |
| 6,621,707 B2 | 9/2003 | Ishimine et al. | |
| 6,644,058 B2 | 11/2003 | Bash et al. | |
| 6,664,627 B2 | 12/2003 | Cheon | |
| 6,817,204 B2 | 11/2004 | Bash et al. | |
| 6,853,554 B2 | 2/2005 | Bash et al. | |
| 6,881,609 B2 | 4/2005 | Salmon | |
| 6,882,533 B2 | 4/2005 | Bash et al. | |
| 6,890,799 B2 | 5/2005 | Daikoku et al. | |
| 6,927,471 B2 | 8/2005 | Salmon | |
| 7,069,737 B2 | 7/2006 | Wang et al. | |
| 7,144,792 B2 | 12/2006 | Wilmot et al. | |
| 7,163,830 B2 | 1/2007 | Salmon | |
| 7,240,500 B2 | 7/2007 | Bash et al. | |
| 7,254,024 B2 | 8/2007 | Salmon | |
| 7,297,572 B2 | 11/2007 | Salmon | |
| 7,408,258 B2 | 8/2008 | Salmon | |
| 7,415,289 B2 | 8/2008 | Salmon | |
| 7,427,809 B2 | 9/2008 | Salmon | |
| 7,455,094 B2 | 11/2008 | Lee et al. | |
| 7,505,862 B2 | 3/2009 | Salmon | |
| 7,535,107 B2 | 5/2009 | Salmon | |
| 7,586,747 B2 | 9/2009 | Salmon | |
| 7,658,614 B2 | 2/2010 | Wilmot et al. | |
| 7,659,141 B2 | 2/2010 | Chung-Long-Shan et al. | |
| 7,738,250 B2 | 6/2010 | Wu et al. | |
| 7,902,666 B1 | 3/2011 | Hsu et al. | |
| 7,946,465 B2 | 5/2011 | Silverbrook et al. | |
| 7,952,191 B2 | 5/2011 | Sunohara et al. | |
| 7,988,033 B2 | 8/2011 | Chung-Long-Shan et al. | |
| 8,252,635 B2 | 8/2012 | Salmon | |
| 8,369,091 B2 | 2/2013 | Campbell | |
| 8,457,806 B2 | 6/2013 | Shah | |
| 8,685,833 B2 | 4/2014 | Khanna et al. | |
| 8,780,552 B2 * | 7/2014 | El-Essawy | H05K 7/02 |
| | | | 165/104.34 |
| 8,787,015 B2 | 7/2014 | El-Essawy | |
| 8,842,688 B2 | 9/2014 | Vahdat | |
| 8,922,511 B1 | 12/2014 | Salmon | |
| 9,059,070 B2 | 6/2015 | Salmon | |
| 9,061,893 B1 * | 6/2015 | Minervini | H04R 1/04 |
| 9,095,942 B2 | 8/2015 | Campbell | |
| 9,142,533 B2 | 9/2015 | Shen et al. | |
| 9,214,416 B1 | 12/2015 | Furnival | |
| 9,227,220 B1 | 1/2016 | Salmon | |
| 9,250,024 B2 | 2/2016 | Campbell | |
| 9,257,751 B2 | 2/2016 | Felic et al. | |
| 9,386,685 B2 | 7/2016 | Bonkohara | |
| 9,493,102 B2 | 11/2016 | Tang et al. | |
| 9,576,409 B2 | 2/2017 | Salmon | |
| 9,633,771 B2 | 4/2017 | Salmon | |
| 9,761,620 B1 | 9/2017 | Salmon | |
| 9,773,755 B2 | 9/2017 | Shen et al. | |
| 9,874,923 B1 | 1/2018 | Brown | |
| 10,039,210 B2 | 7/2018 | Wong | |
| 10,249,503 B2 | 4/2019 | Yoon et al. | |
| 10,336,599 B2 | 7/2019 | Miles | |
| 10,461,009 B2 | 10/2019 | Hung et al. | |
| 10,481,650 B2 * | 11/2019 | Saito | H05K 7/20781 |
| 10,613,603 B2 | 4/2020 | Bose | |
| 10,624,236 B2 * | 4/2020 | Inano | H05K 7/20236 |
| 10,757,833 B2 | 8/2020 | Bodenweber | |
| 10,910,364 B2 | 2/2021 | Or-Bach | |
| 10,966,338 B1 | 3/2021 | Salmon | |
| 11,064,626 B1 | 7/2021 | Salmon | |
| 11,138,103 B1 | 10/2021 | Shi | |
| 11,256,320 B2 | 2/2022 | Mcnamara | |
| 11,379,254 B1 | 7/2022 | Karumbunathan | |
| 11,393,807 B2 | 7/2022 | Salmon | |
| 11,445,640 B1 * | 9/2022 | Salmon | H05K 7/20781 |
| 11,523,543 B1 | 12/2022 | Salmon | |
| 11,546,991 B2 | 1/2023 | Salmon | |
| 11,692,271 B2 | 7/2023 | Miljkovic et al. | |
| 11,856,727 B2 * | 12/2023 | Montes Monteserin | |
| | | | H05K 7/20236 |
| 2001/0042777 A1 | 11/2001 | Kyomasu et al. | |
| 2003/0000552 A1 | 1/2003 | Bratten et al. | |
| 2003/0151130 A1 | 8/2003 | Cheon | |
| 2005/0126766 A1 | 6/2005 | Lee | |
| 2005/0240812 A1 | 10/2005 | Anderson | |
| 2005/0254214 A1 | 11/2005 | Salmon | |
| 2006/0244926 A1 | 11/2006 | Shih et al. | |
| 2007/0007983 A1 | 1/2007 | Salmon | |
| 2007/0074853 A1 | 4/2007 | Popovich | |
| 2007/0176298 A1 | 8/2007 | Osone | |
| 2007/0240785 A1 | 10/2007 | Lee | |
| 2007/0256773 A1 | 11/2007 | Huang | |
| 2009/0185343 A1 | 7/2009 | Wu | |
| 2010/0275971 A1 | 11/2010 | Zingher | |
| 2011/0192172 A1 | 8/2011 | Delacruz | |
| 2011/0302346 A1 | 12/2011 | Vahdat | |
| 2012/0165908 A1 | 6/2012 | Kou et al. | |
| 2012/0217772 A1 | 8/2012 | Tang | |
| 2013/0015578 A1 | 1/2013 | Thacker | |
| 2013/0228898 A1 | 9/2013 | Ide | |
| 2014/0123492 A1 | 5/2014 | Campbell | |
| 2014/0137581 A1 | 5/2014 | Cho | |
| 2015/0199858 A1 | 7/2015 | Salmon | |
| 2016/0081227 A1 | 3/2016 | Lee | |
| 2016/0088756 A1 * | 3/2016 | Ramadas | C08J 7/048 |
| | | | 361/728 |
| 2016/0155682 A1 | 6/2016 | Ahuja et al. | |
| 2017/0015477 A1 | 1/2017 | Miles | |
| 2017/0254574 A1 | 9/2017 | Kim | |
| 2017/0292782 A1 | 10/2017 | Joyer et al. | |
| 2017/0308133 A1 | 10/2017 | Soffer | |
| 2017/0354061 A1 * | 12/2017 | Saito | G06F 1/206 |
| 2018/0170744 A1 | 6/2018 | Petersen et al. | |
| 2018/0293017 A1 | 10/2018 | Curley | |
| 2018/0315730 A1 | 11/2018 | Gill et al. | |
| 2018/0320937 A1 | 11/2018 | Deng et al. | |
| 2019/0041104 A1 | 2/2019 | Yin | |
| 2019/0041105 A1 | 2/2019 | Yin | |

(56)  References Cited

U.S. PATENT DOCUMENTS

| | | | |
|---|---|---|---|
| 2019/0286373 | A1 | 9/2019 | Karumbunathan et al. |
| 2019/0363196 | A1 | 11/2019 | Wood |
| 2019/0377391 | A1 | 12/2019 | Chen |
| 2020/0022601 | A1* | 1/2020 | Rogers .............. H01L 21/02164 |
| 2020/0027809 | A1 | 1/2020 | Hung et al. |
| 2020/0029465 | A1 | 1/2020 | Chainer |
| 2020/0089293 | A1* | 3/2020 | Enright .............. H05K 7/20818 |
| 2020/0091111 | A1 | 3/2020 | Lee et al. |
| 2020/0093038 | A1 | 3/2020 | Enright |
| 2020/0243429 | A1 | 7/2020 | Lai et al. |
| 2020/0310394 | A1 | 10/2020 | Wouhaybi |
| 2020/0328139 | A1 | 10/2020 | Chiu |
| 2021/0343690 | A1* | 11/2021 | Salmon .............. H05K 7/20463 |
| 2022/0087048 | A1* | 3/2022 | Enright .............. H05K 7/20818 |
| 2022/0113784 | A1 | 4/2022 | Alben et al. |
| 2022/0217845 | A1 | 7/2022 | Salmon |
| 2023/0088049 | A1 | 3/2023 | Salmon |
| 2023/0180439 | A9 | 6/2023 | Enright |
| 2023/0276600 | A1 | 8/2023 | Salmon |
| 2023/0380101 | A1 | 11/2023 | Sullivan |
| 2023/0413466 | A1 | 12/2023 | Heydari |

OTHER PUBLICATIONS

Gebrael et al., High-Efficiency Cooling via the Monolithic Integration of Copper on Electronic Devices, Nature Electronics, 2022, vol. 5, pp. 394-402.

* cited by examiner

10

30

| Part | A, mm$^2$ | t, mm | P, W | σ, W/m°C | θ°C/W | ΔT$_2$, °C |
|---|---|---|---|---|---|---|
| HPC chip | 814 | 0.050 | 700 | 149 | 0.00041 | 0.289 |
| Backside power distribution, Si3N4 | 814 | 0.005 | 700 | 2.1 | 0.00293 | 2.048 |
| Backside power distribution, copper | 814 | 0.005 | 700 | 390 | 0.00002 | 0.011 |
| Water-impermeable coating, Si3N4 | 814 | 0.005 | 700 | 2.1 | 0.00293 | 2.048 |
| Water-impermeable coating, metal | 814 | 0.005 | 700 | 106 | 0.00006 | 4.395 |
|  |  |  |  |  |  | 8.789 |

FIG. 17

|  | Summit | Frontier | Proposed (1) | Proposed (2) |
|---|---|---|---|---|
| Footprint | 5,600 sq. ft. | 7,300 sq. ft. | 1,000 sq. ft. | 12,000 sq. ft. |
| Nodes | 4,608 | ~ 9,000 | 16 | 960 |
| Fiber length | 185 miles | TBD | TBD | TBD |
| Power | 13 MW | 30 MW | 39 MW | 2.4GW |
| Weight | 340 tons | TBD | TBD | TBD |
| Water flow | 4,600 gpm | 5,900 gpm | 4,800 gpm | 288,000 gpm |
| Power density | 1.6 W/in$^3$ | ~ 4.7 W/in$^3$ | 840W/in$^3$ | 840W/in$^3$ |
| Performance | 200 petaflops | ~ 1.1 exaflops | ~ 20 exaflops | ~ 1.2 zettaflops |

FIG. 18

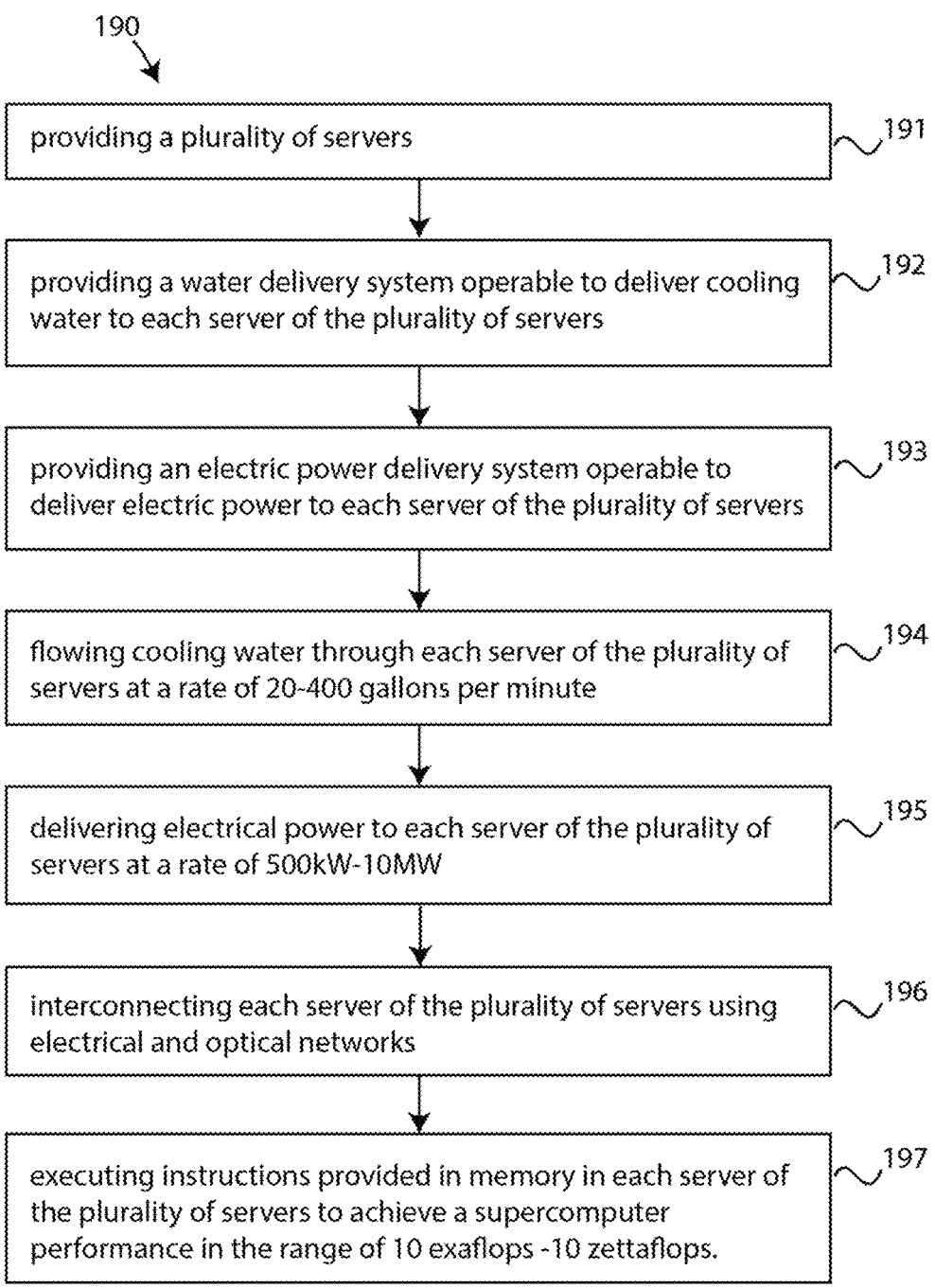

190

| providing a plurality of servers | 191 |

| providing a water delivery system operable to deliver cooling water to each server of the plurality of servers | 192 |

| providing an electric power delivery system operable to deliver electric power to each server of the plurality of servers | 193 |

| flowing cooling water through each server of the plurality of servers at a rate of 20-400 gallons per minute | 194 |

| delivering electrical power to each server of the plurality of servers at a rate of 500kW-10MW | 195 |

| interconnecting each server of the plurality of servers using electrical and optical networks | 196 |

| executing instructions provided in memory in each server of the plurality of servers to achieve a supercomputer performance in the range of 10 exaflops -10 zettaflops. | 197 |

FIG. 19

ZETTASCALE SUPERCOMPUTER

PRIORITY CLAIM AND RELATED PATENT APPLICATIONS AND PATENTS

This application claims priority to U.S. Prov. App. No. 63/399,171, filed Aug. 18, 2022, entitled "EXASCALE SUPERCOMPUTER," hereby incorporated by reference in its entirety.

This application is related to U.S. patent application Ser. No. 17/989,549, filed Nov. 17, 2022, which is a continuation of U.S. Pat. No. 11,546,991, filed Mar. 2, 2022, which is a continuation-in-part of U.S. Pat. No. 11,393,807, filed Jul. 8, 2021, which is a continuation-in-part of U.S. Pat. No. 10,966,338, filed Mar. 11, 2020, each entitled "DENSELY PACKED ELECTRONIC SYSTEMS," and each hereby incorporated by reference in their entireties.

U.S. Pat. No. 11,546,991 is also a continuation-in-part of U.S. Pat. No. 11,393,807, filed Jul. 8, 2021, entitled "DENSELY PACKED ELECTRONIC SYSTEMS," which is a continuation-in part of U.S. Pat. No. 10,966,338, filed Mar. 11, 2020, entitled "DENSELY PACKED ELECTRONIC SYSTEMS," which claims priority to U.S. Prov. App. No. 63/129,477, filed Dec. 22, 2020, entitled "GLASS CIRCUIT ASSEMBLY AND LAMINATE STRUCTURE," U.S. Prov. App. No. 63/135,990, filed Jan. 11, 2021, entitled "DENSELY PACKED ELECTRONIC SYSTEMS," U.S. Prov. App. No. 63/164,437, filed Mar. 22, 2021, entitled "AGILE RECONFIGURABLE ELECTRONIC SYSTEMS," and U.S. Prov. App. No. 63/159,212, filed Mar. 10, 2021, entitled "ELECTRONIC ASSEMBLY HAVING INDEPENDENTLY OPERABLE CLUSTERS OF COMPONENTS," and each hereby incorporated by reference in their entireties.

This application is also related to U.S. patent application Ser. No. 17/982,393, filed Nov. 7, 2022, which is a continuation-in-part of U.S. Pat. No. 11,523,543, filed May 6, 2022, which is a continuation-in-part of U.S. Pat. No. 11,445,640, filed Feb. 25, 2022, each entitled "WATER COOLED SERVER," and each hereby incorporated by reference in their entireties.

This application is also related to U.S. Prov. App. No. 63/522,540, filed Jun. 22, 2023, entitled "MICROELECTRONIC MODULE," hereby incorporated by reference in its entirety.

This application is also related to U.S. Pat. No. 11,064, 626, filed Oct. 14, 2020, which is a divisional of U.S. Pat. No. 10,966,338, filed Mar. 11, 2020, each entitled "DENSELY PACKED ELECTRONIC SYSTEMS," and each hereby incorporated by reference in their entireties.

TECHNICAL FIELD

Embodiments of the application relate to supercomputers, and more particularly, to a zettascale supercomputer employing water cooling.

BACKGROUND

Prior art supercomputing systems include the SUMMIT-IBM Power System AC922 and the FRONTIER OLCF-5 supercomputer produced by Hewlett Packard Enterprise. Summit was ranked the world's fastest supercomputer from November 2018 through June 2019. Frontier was installed at the Oak Ridge National Laboratory in 2021 and was the world's fastest supercomputer in 2022. Both systems employ water cooling. The specified performances are Summit at 200 petaflops, and Frontier at 1.1 exaflops.

SUMMARY

In an embodiment of the present disclosure, a supercomputer comprises an array of servers in at least one computer pod; each server comprising a tank in which cooling water is flowing and a plurality of computer modules disposed within the tank, each computer module including a coating that is impermeable to water except for an opening at the top.

In an embodiment, the supercomputer comprises a motherboard including both electrical and optical input/output connectors for connecting between computer modules and with external signals and power. In an embodiment, the supercomputer comprises a set of bus bars that carry power in a range of 4-180 MW from a power station to each computer pod.

In an embodiment, the power carried by the bus bars is DC power, having a voltage in a range of 100-2000 volts and current in a range of 4,000-100,000 amperes.

In an embodiment, each server comprises a hose input and a hose output, wherein the hose input couples with a first water conduit and the hose output couples with a second water conduit, and the first conduit carries cooling water at a lower temperature than the second conduit. The hose input and the hose output may each be sized to carry cooling water at a rate of 20-400 gallons per minute, with water pressure created by at least one pump. In alternate embodiments, the water-cooling conduits may comprise a straight pipe or a ring configuration.

In an embodiment, each server comprises a plurality of computer modules disposed in a tank of water, wherein each computer module comprises a circuit assembly having semiconductor chips mounted on a substrate, and each module includes a water-impermeable coating that coats the entire module except for an opening at the top where input/output connections are made. In an embodiment, the water-impermeable coating comprises a first layer that is a conformable coating. In a further embodiment, the water-impermeable coating comprises a metal layer. In a further embodiment, the water-impermeable coating comprises plasma-activated covalent bonds between the first layer and the underlying circuit assembly. In a further embodiment the water-impermeable coating comprises a first layer of titanium dioxide; a second adhesion layer comprising a treatment of A-174 SILANE; and a third layer comprising parylene C.

In an embodiment, each pod comprises servers disposed with an adjustable number of columns and an adjustable number of rows, wherein each column and each row may support an adjustable number of servers. The servers may be positioned in computer racks. In an embodiment a single pod is arranged with 2-6 columns and 2-16 rows of servers and is operable with a compute power of 4-180 megawatts.

In an embodiment, a supercomputer comprises 12-18 computer pods, the supercomputer operable in a power range of 500 MW-10 GW.

In some embodiments, the computer pods are arranged to form supercomputers in linear, circular, and/or rectangular configurations.

In an embodiment a supercomputer comprises an array of servers wherein each server comprises a water containment vessel containing a plurality of computer modules; a water delivery system comprising pipes and pumps and delivery of cooling water to each of the water containment vessels. In an embodiment, the rate of water flow in each server is in a range of 20-400 gallons per minute. In an embodiment, an electrical power delivery system delivers power to each server in a range of 500 kW-10 MW. In an embodiment the supercomputer comprises 4-2,000 servers.

In an embodiment, a method for building and operating a supercomputer comprises: providing a plurality of servers configurable in computer pods containing 10-200 servers per pod; providing a water delivery system operable to deliver cooling water to each server; providing an electric power delivery system operable to deliver electric power to each pod; flowing cooling water through each server at a rate of 20-400 gallons per minute; delivering electrical power to each computer pod at a rate of 8 MW-160 MW; interconnecting each server using electrical and optical networks; and, executing instructions provided in memory in each server to achieve a supercomputer performance in the range of 10 exaflops-10 zettaflops.

BRIEF DESCRIPTION OF THE DRAWINGS

The accompanying drawings, which are incorporated into and constitute a part of this specification, illustrate prior art and examples of embodiments. The examples of embodiments, together with the description of example embodiments, explain the principles and implementations of the embodiments.

FIG. 17 is a table illustrating the incremental temperature in each element of a thermal path between an HPC chip and cooling water in an embodiment of the present disclosure.

FIG. 18 is a table comparing prior art supercomputers against supercomputers according to embodiments of the present disclosure.

FIG. 19 is a flow chart of a method for configuring and operating a supercomputer in an embodiment of the present disclosure.

DETAILED DESCRIPTION

Figure 1:
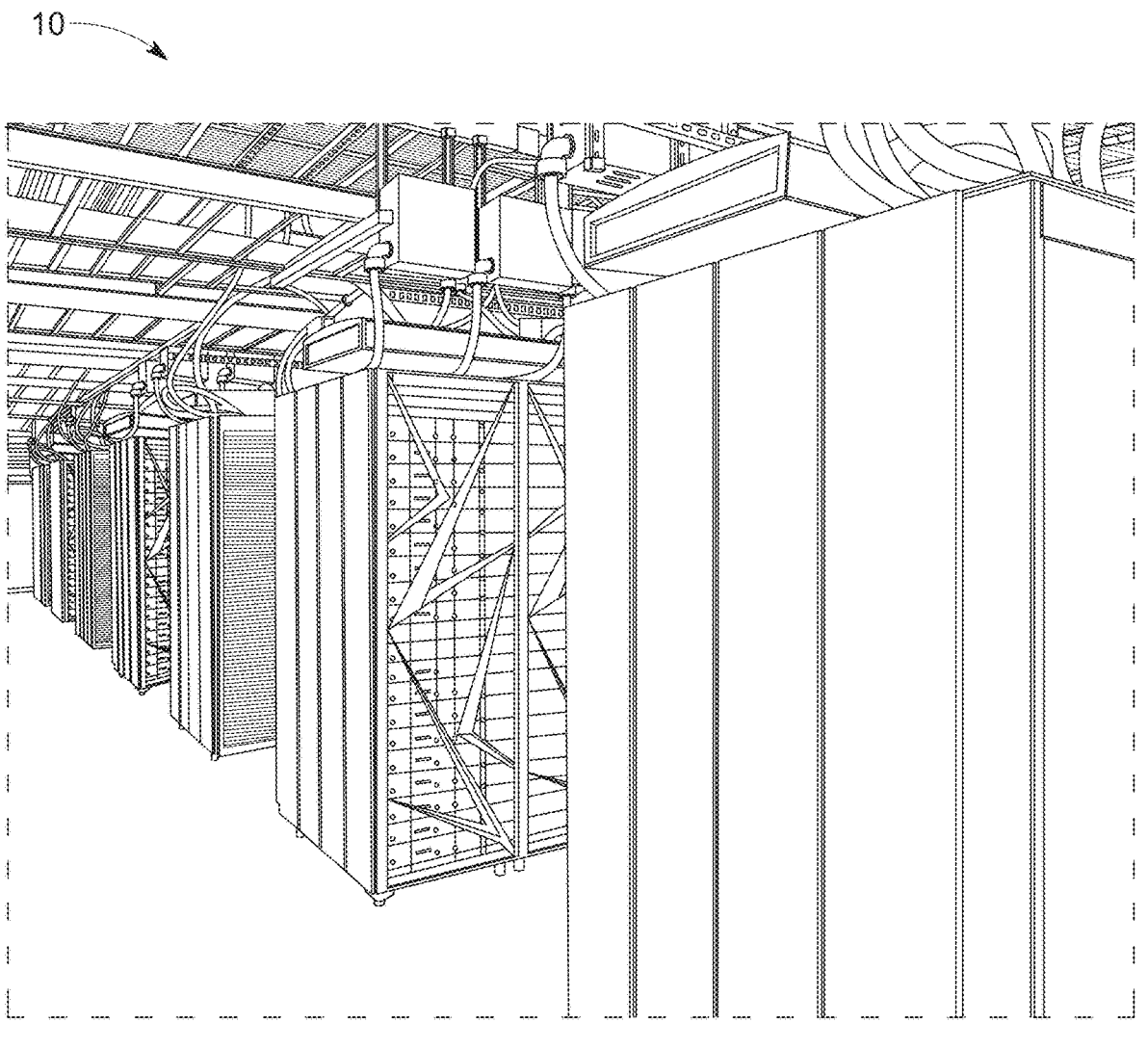
FIG. 1 illustrates a deployment of the SUMMIT-IBM POWER SYSTEM AC922 (PRIOR ART).
Figure 2:
FIG. 2 illustrates server node 8335-GTW, one of 4,608 servers deployed with the SUMMIT-IBM POWER SYSTEM AC922 (PRIOR ART).
Figure 2:
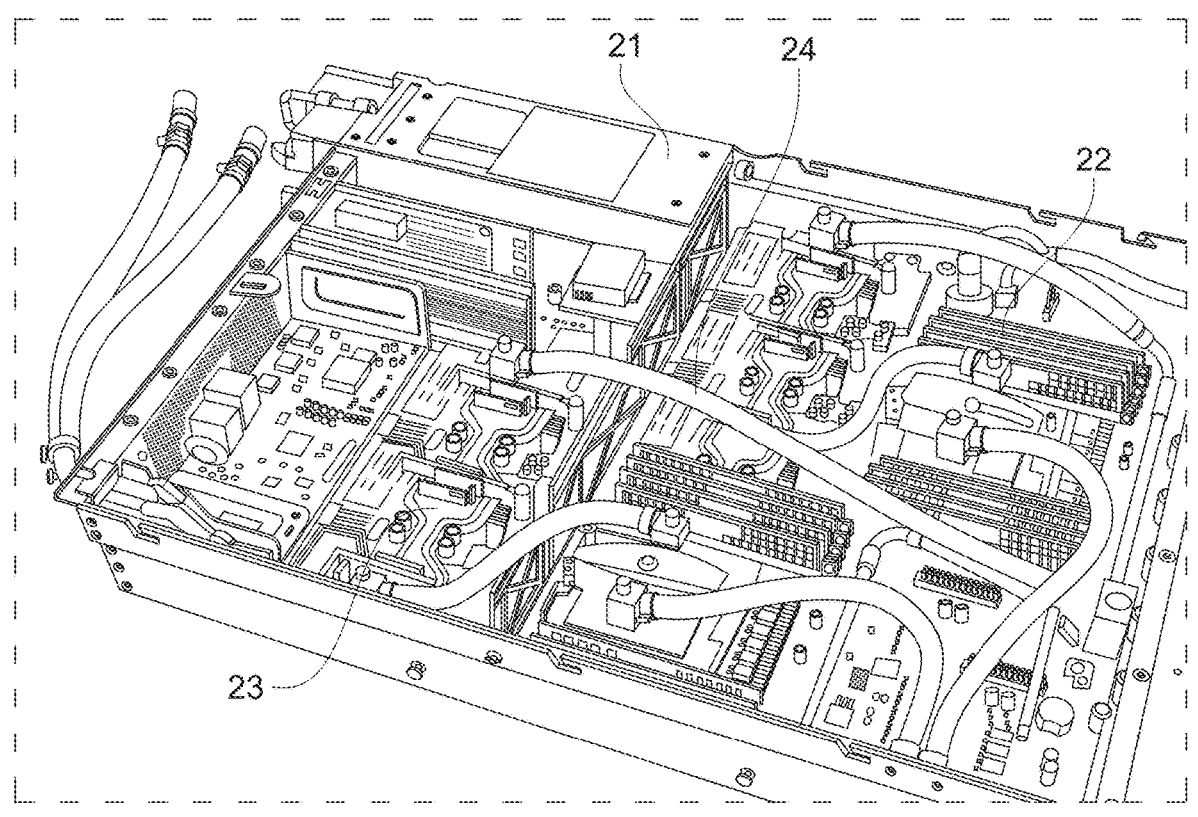

FIG. 1 illustrates a deployment of the prior art supercomputer 10, the SUMMIT-IBM POWER SYSTEM AC922. It is shown organized into pods or blocks. This supercomputer was ranked the world's fastest from November 2018 to June 2019. It is built from 4,608 server nodes, as depicted in FIG. 2. It occupies a footprint of 5,600 square feet. It employs 185 miles of optical fiber. It dissipates 13 MW of power and weighs 340 tons. The total flow rate of cooling water is 4,600 gallons per minute (gpm). It has a power density of 1.6 $W/in^3$, a performance of 200 petaflops, and it cost approximately $200 million.

FIG. 2 illustrates prior art server node 20 of the SUMMIT supercomputer. The figure shows a three-dimensional assembly of metal enclosures 21, circuit boards 22 also described as daughter boards, water-cooled packages 23, and tubing 24 carrying cooling water at a rate of 1.0 gpm. It can be appreciated that server node 20 requires substantial human technical support to assemble the disparate assortment of components including multiple different assemblies, circuit boards and heat sinks, all customized to fit in the available space.

Figure 3:
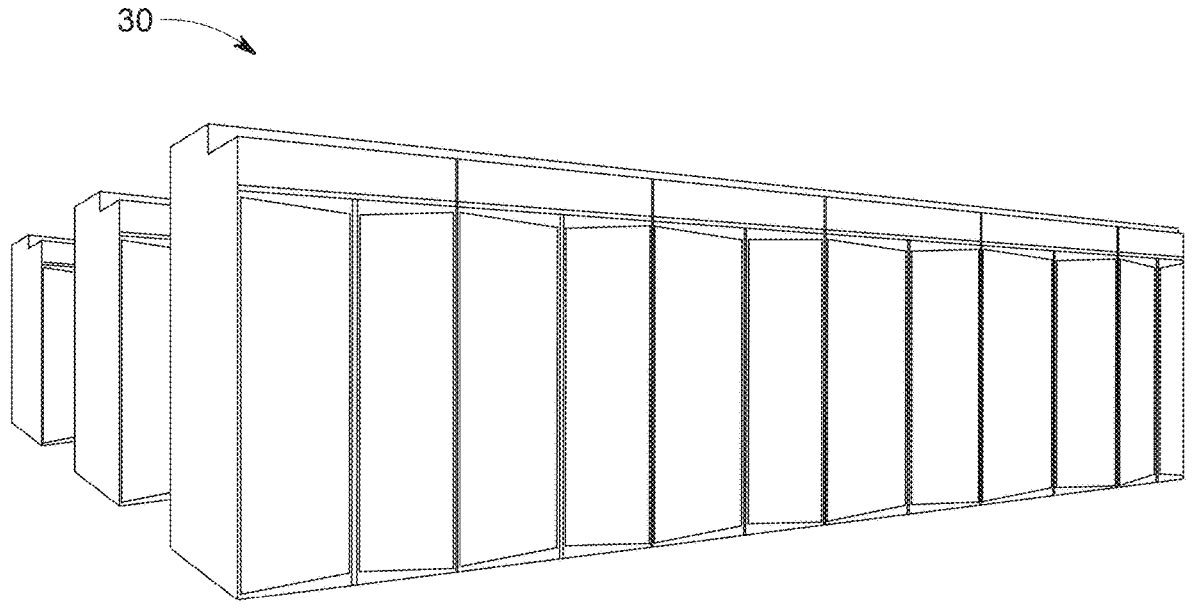
FIG. 3 illustrates a deployment of the FRONTIER OLCF-5 supercomputer (PRIOR ART).

FIG. 3 illustrates a deployment of the prior art supercomputer 30, the FRONTIER OLCF-5. It is shown organized into pods or blocks. It is currently the world's fastest general-purpose supercomputer with a performance of around 1.1 exaflops. It comprises "high density compute blades powered by HPC and AI-optimized AMD EPYC™ processors and RADEON INSTINCT™ GPU accelerators purpose-built for the needs of exascale computing." It occupies a footprint of 7,300 square feet. It employs 9,000 nodes. It dissipates 30 MW of power. The total flow rate of cooling water is 5,900 gpm.

Figure 4:
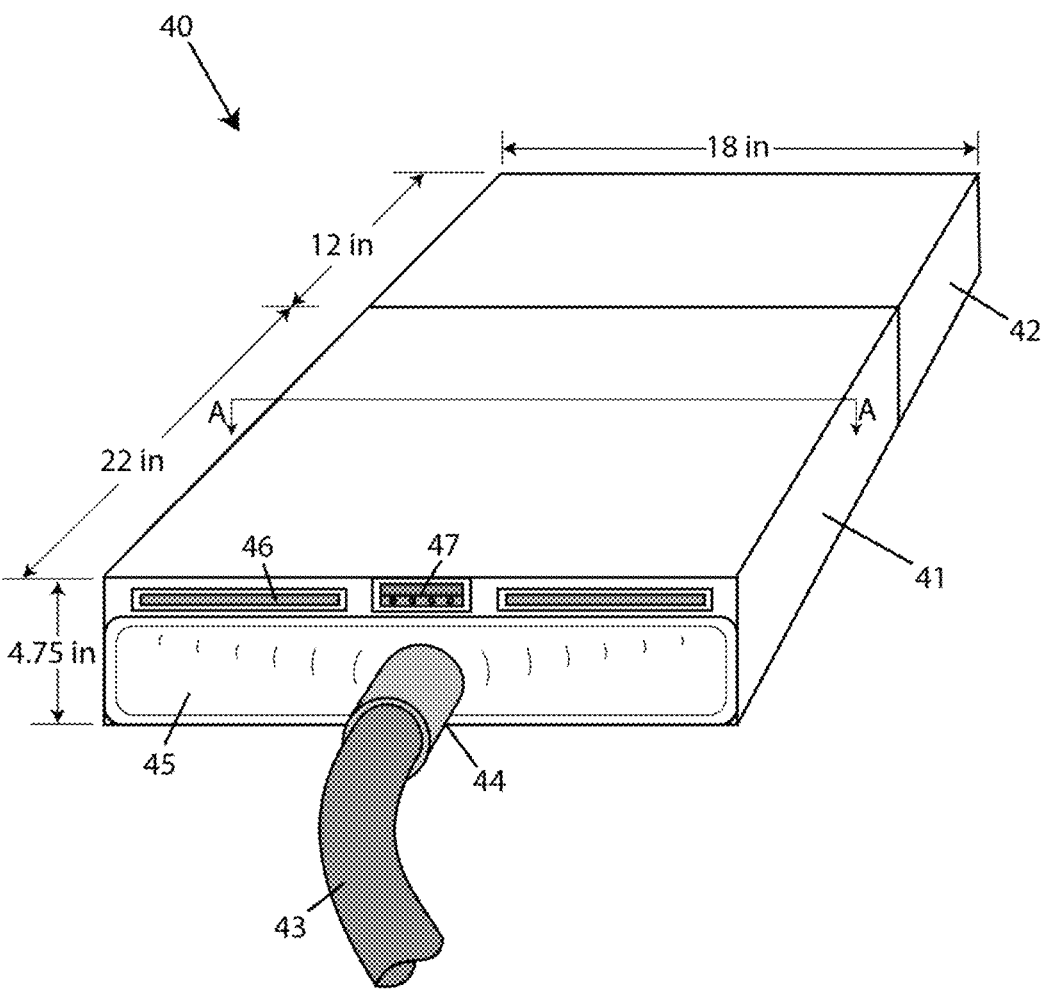
FIG. 4 illustrates a water-cooled server in an embodiment of the present disclosure.

FIG. 4 illustrates a server 40 in accordance with an embodiment of the present disclosure. As shown, the server 40 is 18 inches wide, 4.75 inches high, and 34 inches deep. It will be appreciated that the invention is not limited to these dimensions and that the dimensions may be smaller or larger than 18 inches wide, 4.75 inches high and 34 inches deep. As illustrated, the server 40 having these dimensions fits well in a 3U rack; however, as noted above, the dimensions may vary from those illustrated and the rack may vary with the dimensions of the server 40.

Server 40 includes a densely packed front assembly 41 and a bus bar assembly 42. Cooling water enters through input hose 43 which employs a coupler 44 to connect with front cover plate 45 which distributes the incoming water across the face of server 40. Electrical connectors 46 and optical connectors 47 are provided for connecting between servers and also connecting with external signals and power. Many connector and signaling arrangements are possible within the scope of this embodiment.

As illustrated, hose 43 has an internal diameter of 2 inches and delivers cooling water at a rate of 300 gpm although water cooling flow rates in a range of 20-500 gpm per server may be used. The water velocity inside hose 43 may be in the range of 1-10 ft/sec. At least one pump is used to pressurize the coolant water for delivery via pipes and water conduits to each server 40. At 300 gpm the velocity of cooling water inside server 40 is around 29 in/sec. It will be appreciated that the size of the hose, cooling water flow rates, and velocity may vary from those discussed above.

Figure 5:
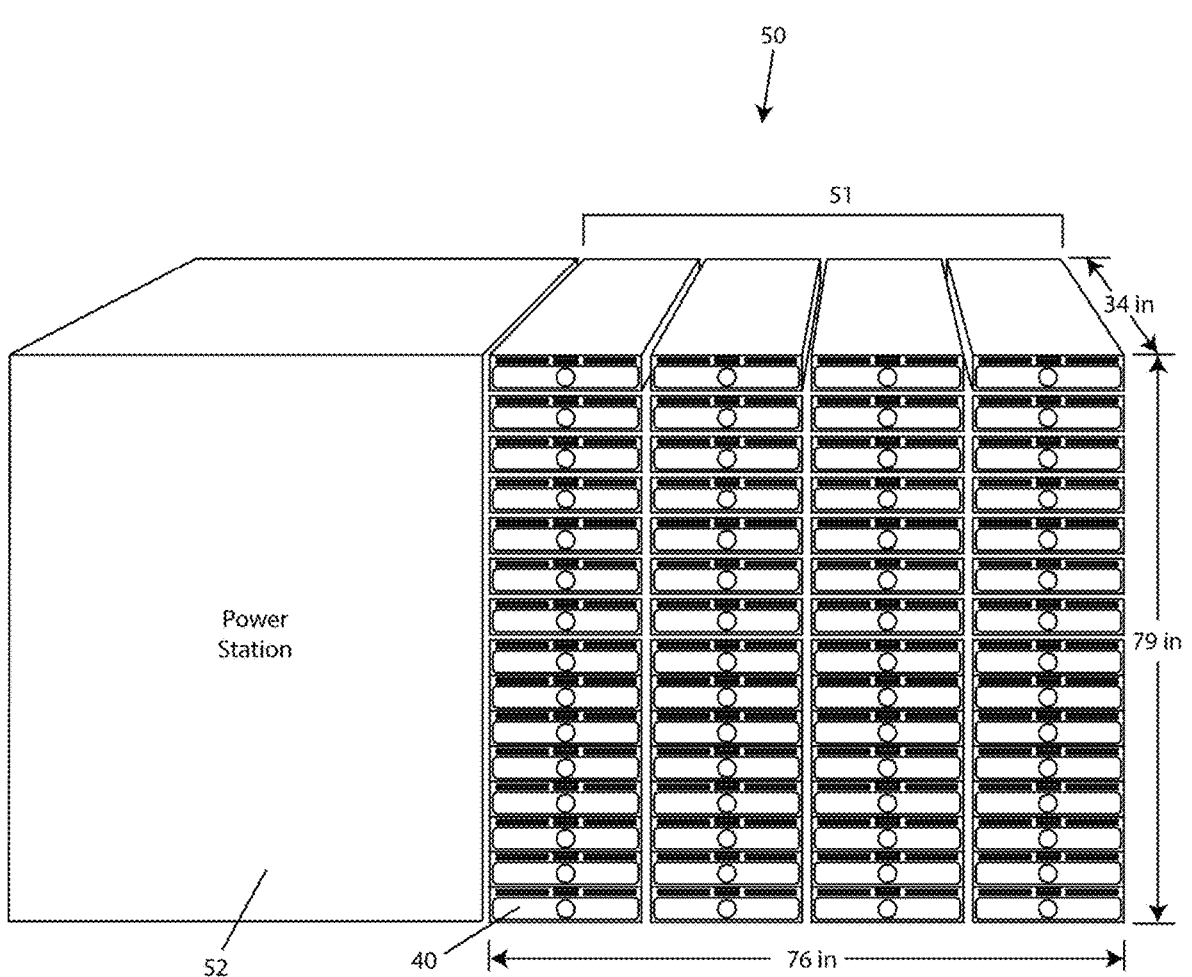
FIG. 5 illustrates a supercomputer pod connected to a power station in an embodiment of the present disclosure.

FIG. 5 illustrates a computing system 50. In one embodiment, the computer system 50 includes a computer pod 51 including sixty servers 40 connected to a power station 52. As shown in FIG. 5, computer pod 51 comprises 4 columns and 15 rows of servers 40. An enclosed version of computer pod 51 may be described as a computer cabinet.

In FIG. 5, for convenience in deploying servers 40 including their placement and interconnections, a 3U computer rack is used, each rack space having a width of 19 inches, a height of 5.25 inches and a depth of 34 inches. It will be appreciated that limiting the number of columns to 4, as shown in FIG. 5, may be useful for limiting the size of bus bars required to distribute megawatts of power to each row of servers in a computer pod. It will be appreciated that the dimensions of the rack may vary from that illustrated in FIG. 5; further the number of columns may be less than or greater than 4.

Many forms of power station 52 may be used in embodiments of the present disclosure, including a substation connected to a power grid having high voltage transmission lines such as 15 kV or 63 kV lines. Alternatively power station 52 may comprise a solar energy or a wind farm facility, including an energy storage capability. Tanks containing liquid salts may be used for the energy storage capability; large-scale batteries may also be used. As a further alternative power station 52 may comprise a nuclear reactor.

Figure 6:
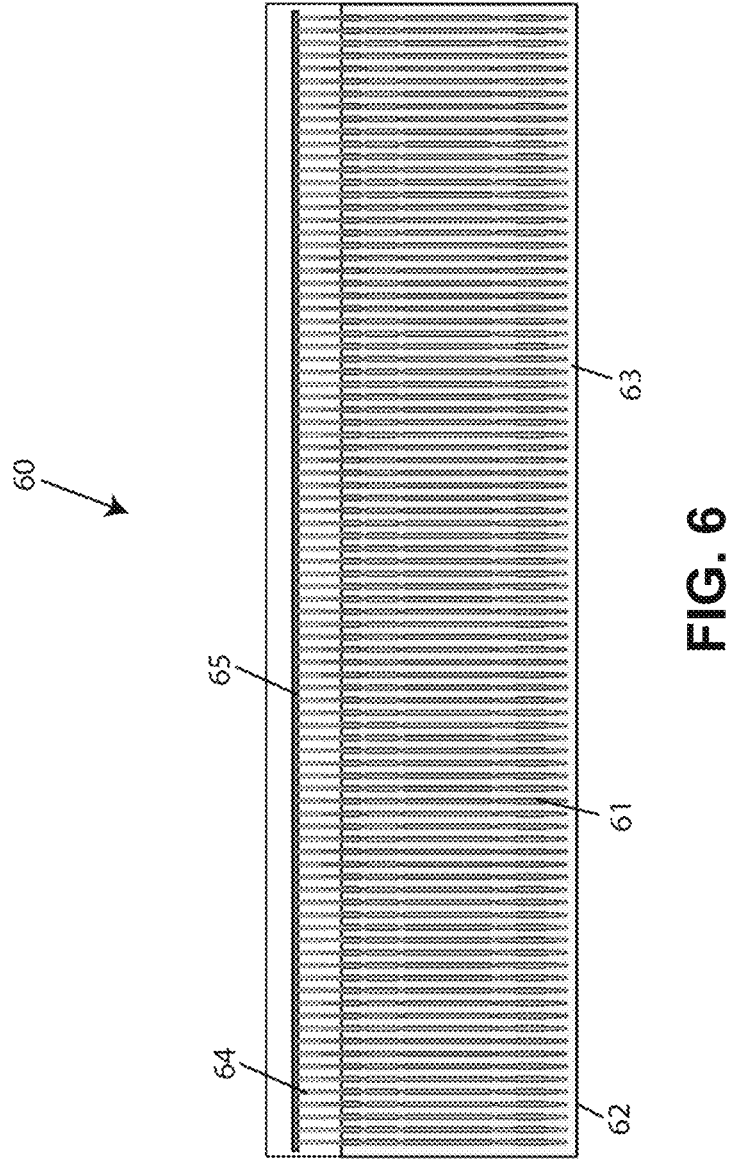
FIG. 6 is a cross-sectional view of the server of FIG. 4 in an embodiment of the present disclosure.

FIG. 6 is a cross-sectional view 60 of server 40 through section AA of FIG. 4. In FIG. 6, ninety computer modules 61 are arrayed inside tank 62 which is filled with circulating cooling water 63. The cooling water 63 enters at input hose 43 of server 40 and exits at an output hose 95 of server 40, described in further detail below in reference to FIG. 9. As the cooling water passes by mounted components on each substrate 66, heat from the components is dissipated in the cooling water, as will be described in further detail below in reference to FIG. 16 and Table 1. Because of a very low thermal resistance in the thermal path from component to cooling water, the cooling effect is very strong; it enables extreme compaction of server 40 compared against prior art servers such as depicted in FIG. 2 In some embodiments, the compaction factor between server 40 and prior art servers can exceed 100X. In an embodiment, the computer modules 61 are spaced apart using wire frames (not shown) that do not significantly impede water flow. As shown in FIG. 6, each computer module 61 connects via a socket 64 to a motherboard 65.

FIG. 6 exemplifies repeated regularized structures in server 40, such as ninety computer modules 61, compared against an assortment of multiple different structures required to implement the prior art server of FIG. 2. Regularized structures can lead to reduced design costs via repetition of computing modules within a server, and repetition of computing tiles within the modules. Regularized structures can also lead to reduced manufacturing costs via automation. An example of such automation is the ability to create a dense panel assembly using a pick and place machine to precisely assemble in a single pass all the chip components on one side of a large panel.

Figure 7:
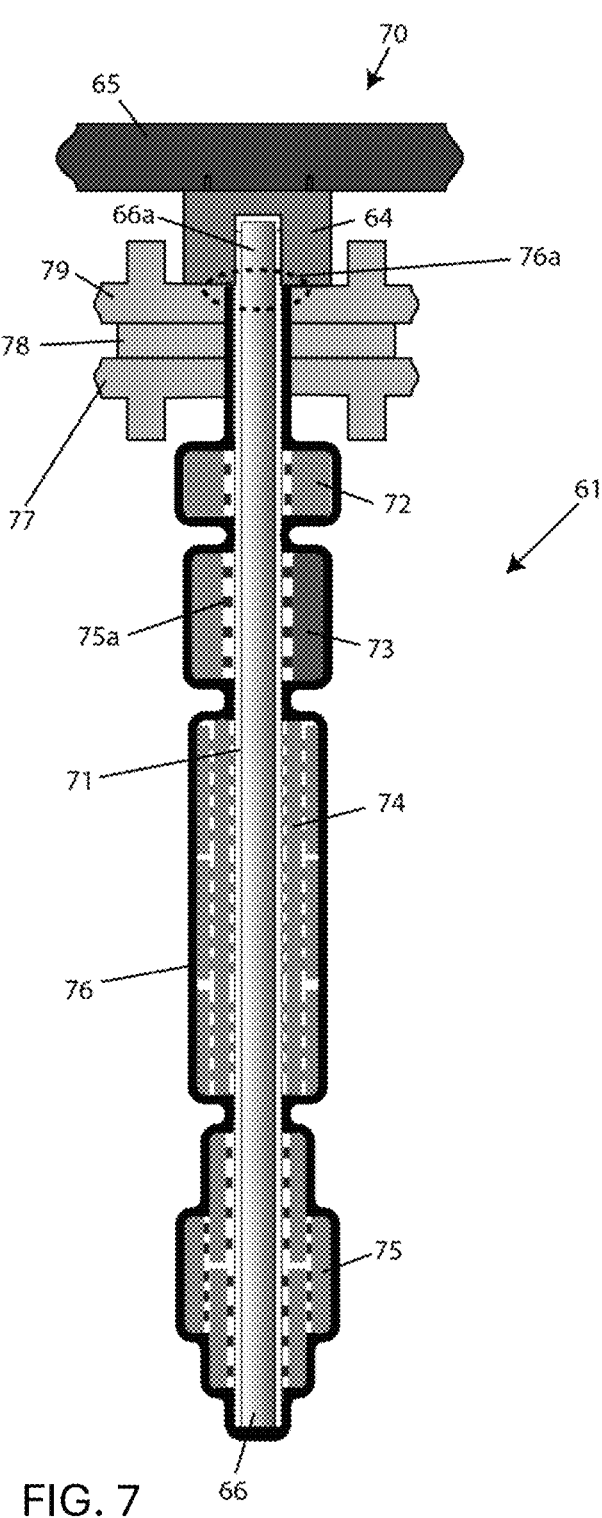
FIG. 7 is an expanded cross-sectional view of a computer module, one of 90 depicted in FIG. 6 in an embodiment of the present disclosure.

FIG. 7 illustrates an expanded cross-sectional view 70 of computer module 61 connected via socket 64 to mother-board 65. In FIG. 7, the horizontal scale is expanded to reveal thin structural elements such as redistribution layers (RDLs) 71 and water-impermeable coating 76. Hi-res substrate 66 is shown with redistribution layers (RDLs) 71. In an embodiment, RDLs 71 comprise thin film conductors and dielectrics wherein some conductors have a half-pitch of 2 μm or less, enabling the mounting of components having a pad pitch of 40 μm or less. It will be appreciated that the dimensions are exemplary and may vary.

Portion 66a of substrate 66 is not coated with the impermeable coating 76; this provides access to thin film conductors that mate with opposing conductors of socket 64, thereby providing input/output connections to computer module 61. Opening 76a in water-impermeable coating 76 is shown.

As shown in FIG. 7, the substrate may include a chip 72, chiplet 73, interposer 74 and bridge device 75. Chiplets are small modular chips that can be combined to form a larger, more complex system-on-a-chip (SOC); they will typically interconnect with one another using a standard interface. An interposer is a semiconductor platform on which multiple semiconductor chips may be mounted and is interposed between a substrate and the mounted chips. A bridge device bridges between two or more chips, each of which shares a common interface area with the bridge device. It will be appreciated that other forms of stacked devices may be employed. In an embodiment, chips 72-75 mounted on substrate 66 are semiconductor chips and may include one or more of bare die, chiplets, stacked devices, surface mount devices, and low-profile packaged devices. In terms of their functionality, semiconductor chips are selected from the group consisting of digital devices, processors, memories, analog devices, radio frequency (RF) devices, optical devices, sensors, passive devices, power conversion devices, voltage regulators and current regulators.

Attachment point 75a may comprise a microbump as shown and will typically employ solder. Attachment point 75a may also comprise a metal-to-metal hybrid bond that does not employ solder. FIG. 7 depicts an embodiment wherein each side of substrate 66 is populated with components in a mirror image of components assembled on the other side; this strategy may be used to limit bowing of substrate 66.

In an embodiment, to prevent water damage to computer module 61, a water-impermeable coating 76 may be employed. To effectively cover any imperfections, defects, microcracks or fissures, water-impermeable coating 76 may include a conformable layer. Since problems such as corrosion and oxidation and poor surface coverage typically result from inadequate adhesion between a coating and its underlying surface, the underlying surface may be plasma-activated during or prior to coating. Plasma-activation promotes the formation of strong covalent bonds at the interface between the coating and the underlying surface. The use of plasma activation may enable a practical and inexpensive water-impermeable coating comprising polyurethane or an acrylic material as examples. The substrate temperature required for plasma-activation may be 50° C. or lower in some processes, enabling the use of organic substrates and commonly used solders for example, or as high as 500° C. in chemical vapor deposition (CVD) processes, requiring the use of a high-temperature substrate such as quartz or glass or silicon or silicon nitride or another ceramic material.

In an embodiment, the water-impermeable coating 76 may comprise PARYLENE C. PARYLENE C is an organic coating that is applied by a CVD process; it is conforming and has been optimized as a water barrier.

In one embodiment, water-impermeable coating 76 may comprise an inorganic coating. The inorganic coating may be a metal oxide such as $TiO_2$, $Al_2O_3$, $SiO_2$, or $HFO_2$. The inorganic coating is typically applied using a CVD process. The inorganic coating may be applied as an atomic layer deposition (ALD).

In one embodiment, the water-impermeable coating 76 may be multi-layered. In one embodiment, the multiple layers comprise a sequence of a metal oxide coating, an adhesion layer, and a PARYLENE C coating. The metal oxide layer may be, for example, $TiO_2$, $Al_2O_3$, $SiO_2$, or $HFO_2$. The metal oxide layer is typically applied using a CVD process. In one embodiment, the metal oxide may be applied as an atomic layer deposition (ALD). In one embodiment, the adhesion layer may be applied using, for example, A-174 SILANE. PARYLENE C is an organic coating that is typically applied by a CVD process. PARYLENE C is conforming and has been optimized as a water barrier. In some embodiments, the three-layer sequence of metal oxide plus adhesion layer plus PARYLENE C is repeated to create an even stronger water barrier.

A gasket 78 is compressed between backing plates 77 and 79 and seals against water intrusion near the top of computer module 61. Opening 76a in water-impermeable coating 76 is shown, providing electrical access to conductive traces in RDL 71.

Figure 8:
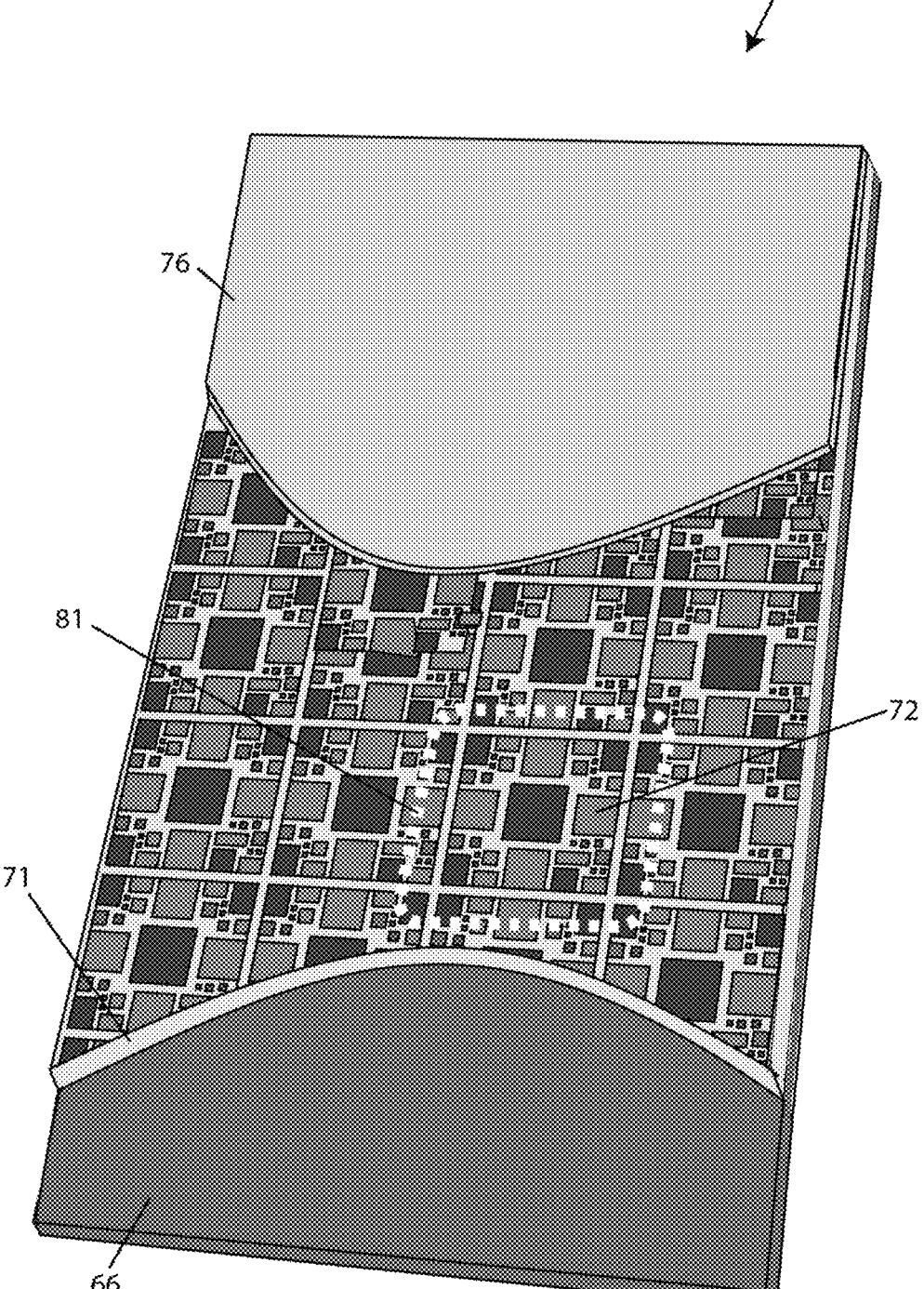
FIG. 8 is a cut-away view of a circuit assembly in an embodiment of the present disclosure.

FIG. 8 illustrates a cut-away view 80 of computer module 61 in accordance with one embodiment of the present disclosure. A high-resolution (hi-res) substrate 66 is shown that comprises a glass-epoxy board with RDLs 71. RDLs 71 comprise a thin film interconnection stack with alternate layers of conductors and dielectrics. Hi-res substrate 66 may be a higher temperature substrate such as EAGLE XG GLASS, available from CORNING, INC. Hi-res substrate 66 may be a photo-sensitive glass to facilitate the fabrication of through glass vias (TGVs). An exemplary chip or chiplet 72 is shown mounted to a top conductive layer of RDLs 71. The water-impermeable coating 76 is also shown covering portions of the substrate 66 and chips or chiplets 72.

In an embodiment, the mounted chiplets and bare die are organized in tiles 81, wherein each tile comprises an independently operable cluster of components. Redundant tiles and redundant components within tiles, together with devices for detecting failed components and replacing them with redundant components, enable agile reconfiguration and workload adaptability for computer modules 61, servers 40, and supercomputers to be further described, such as supercomputers 120, 130, 140 and 150 that employ the servers 40.

Figure 9:
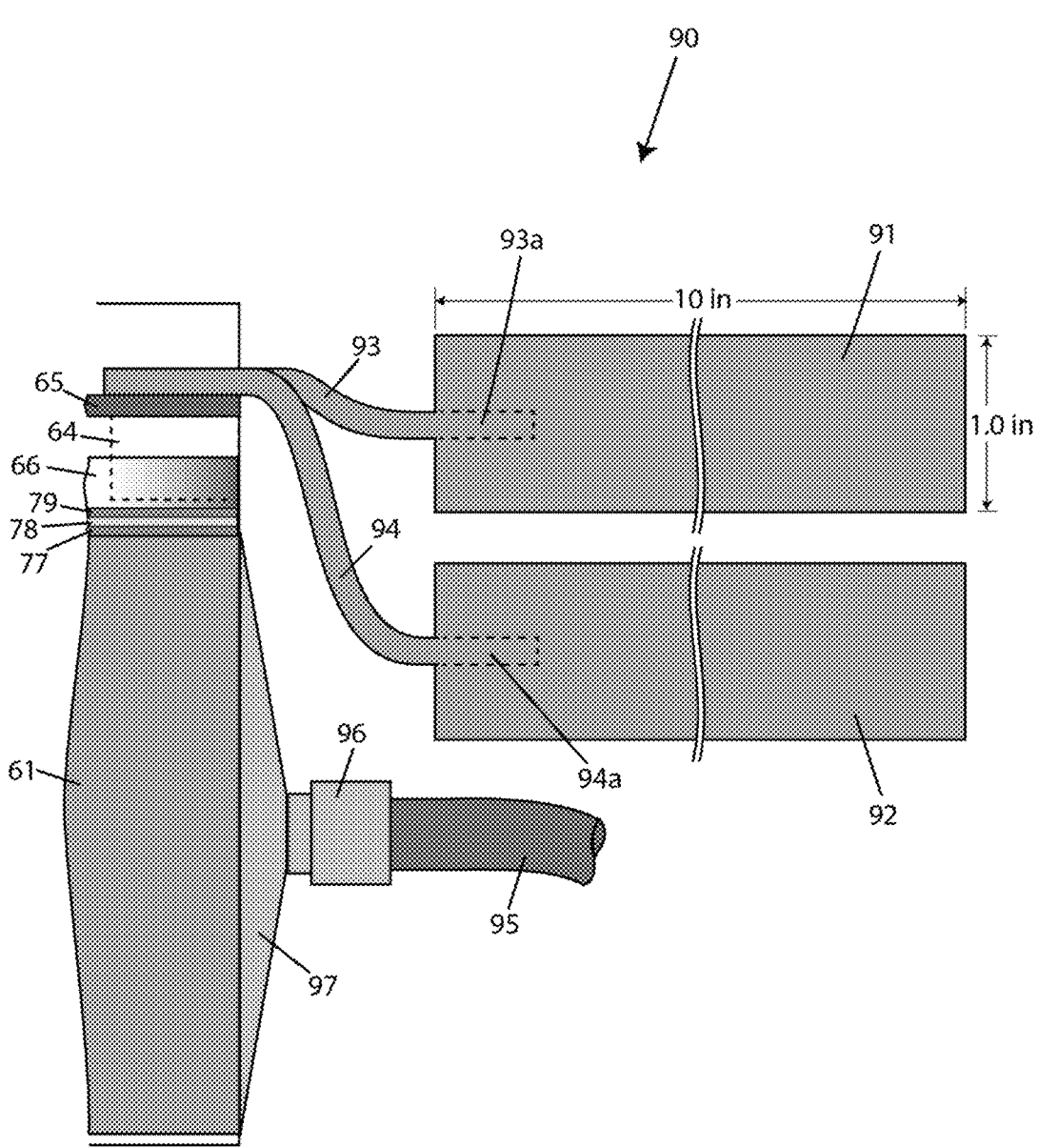
FIG. 9 shows bus bar details in a cross-sectional view, illustrating power delivery to a computer server, in an embodiment of the present disclosure.

FIG. 9 illustrates bus bars 91, 92 for distributing electric power to a computer pod 51 such as depicted in FIG. 5, in an embodiment of the present disclosure. In one embodiment, the bus bars distribute power to a computer pod 51 having 4 columns. Since the components mounted on hi-res substrate 66 in a computer module such as 61 of FIG. 7 are densely packed, and may comprise high-power GPUs and CPUs for example, it can be challenging to distribute sufficient electric power to satisfy the demands of the mounted components, while efficiently using available space. FIG. 9 shows a bus bar 91 for carrying 640V DC and a matching bus bar 92 for carrying GND. In one embodiment, each bus bar has a width of 10 inches and thickness of 1.0 inches and is configured to carry 9,000 A for distribution to 4 servers in a row of a computer pod 91. It will be appreciated that the dimensions and voltage and current the bus bars are configured to carry may vary. Alternative bus bar embodiments include, for example, DC or AC power delivery in a range of 4-180 MW to each computer pod 51; a DC voltage may vary, for example, between 100 and 1,200 volts; a DC current may vary, for example, between 4,000 and 100,000 amperes. In the embodiment shown, transfer sheets 93 and 94 are sized to carry 2,250 A to each server. Low resistance connections such as 93a, 94a are shown between the bus bars and transfer sheets 93, 94; alternative low resistance connections may use clamps to compress the conducting elements together. The rear end of a server 40 is shown, with output hose 95, hose coupling 96, and back cover plate 97. Gasket 78 is compressed between backing plates 77 and 79. Socket 64 couples signals and power from terminals on hi-res substrate 66 to corresponding terminals on the motherboard 65.

Figure 10:
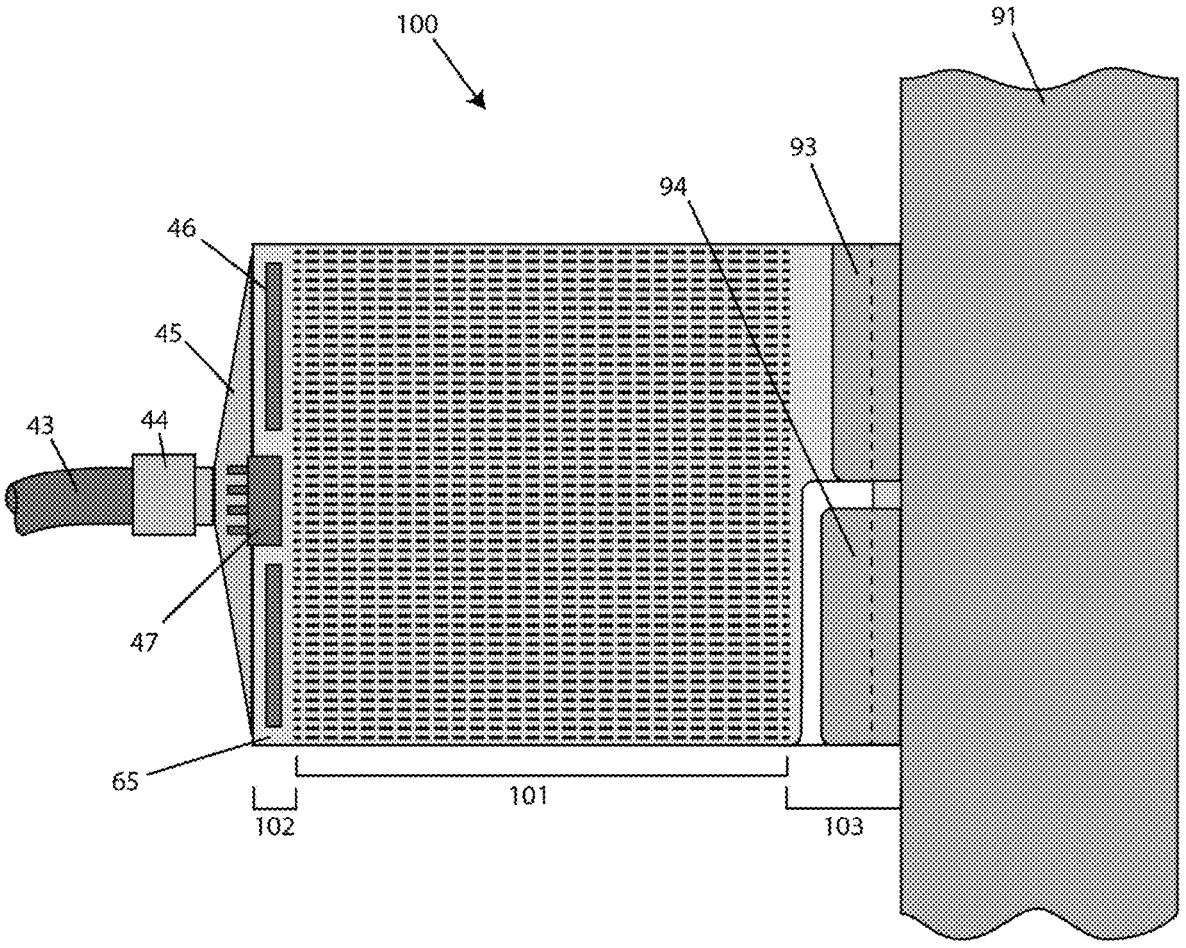
FIG. 10 is a top view of a server with power connections to bus bars in an embodiment of the present disclosure.

FIG. 10 is a top view of bus bars 91, 92 (bus bar 92 is hidden), transfer sheets 93 and 94, and motherboard 65. In an embodiment transfer sheets 93 and 94 are attached to mating conductive surfaces at the top side of the motherboard with low resistance connections, using screws (not shown), for example, to clamp them together. Region 101 of motherboard 64 is assigned to an array of 90 water-cooled computer modules, as discussed in reference to FIG. 6. Region 102 is assigned to external input/output devices such as electrical connectors 46 and optical connectors 47. Region 103 is assigned to power connections, including a dense array of plated through holes (PTHs) connecting the bottom side power plane of motherboard 65 with the top side area mated with transfer sheet 94.

Figure 11:
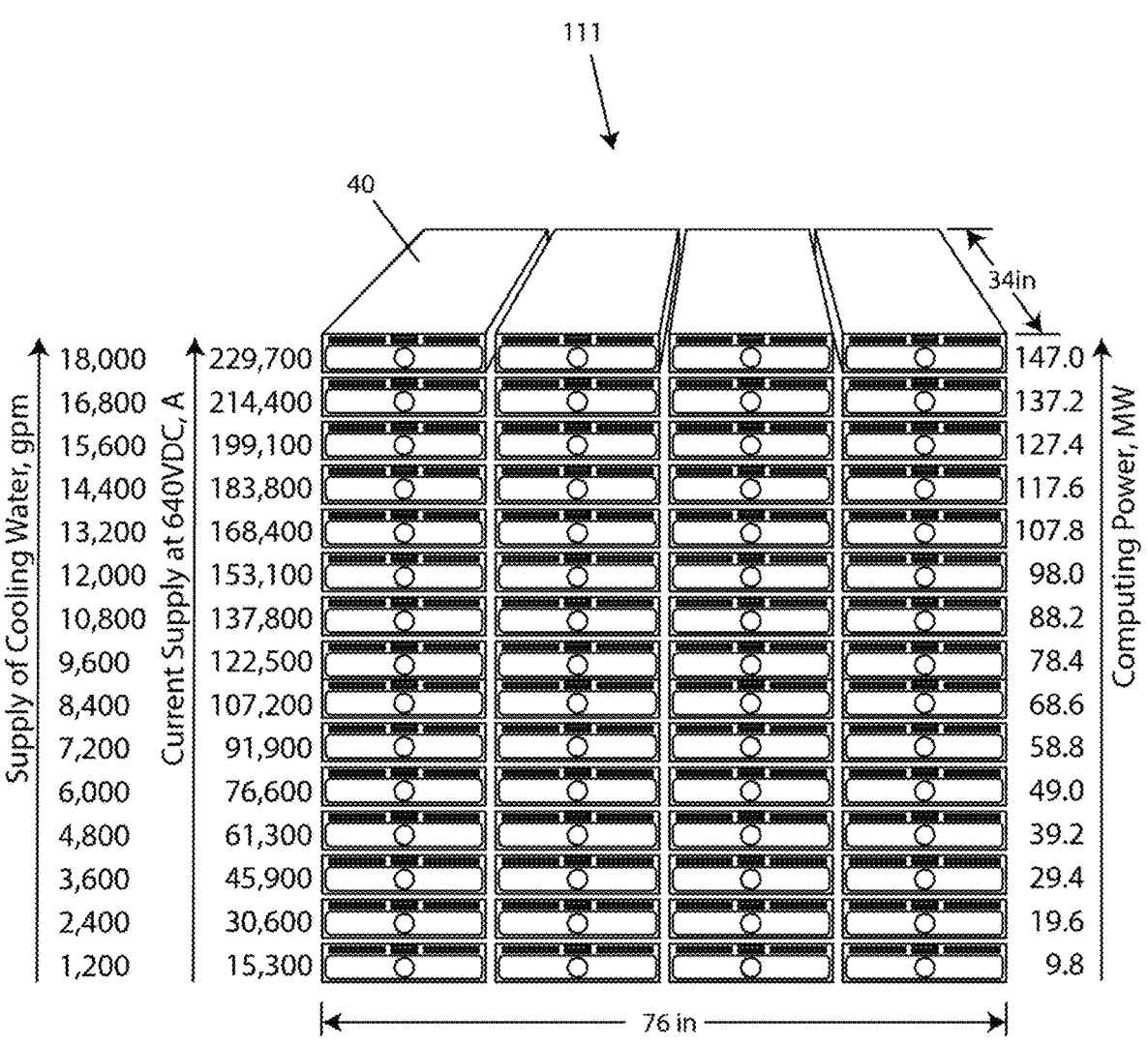
FIG. 11 illustrates sizing options for a computer pod in an embodiment of the present disclosure.

FIG. 11 illustrates a computer pod 111 comprising 4 columns and an adjustable number of rows of servers 40 in an embodiment of the present disclosure. The choice of 4 columns relates to choosing a bus bar configuration of reasonable size, but any suitable number of columns may be used. The following variables scale with the number of rows: computing power in megawatts, the current supply in amperes at 640 VDC, and the supply rate of cooling water in gallons per minute. Accordingly, in a server array, the number of columns and the number of rows is adjustable. Alternative computer pod embodiments will support a computing power of 4-180 MW in a single computer pod.

Figure 12:
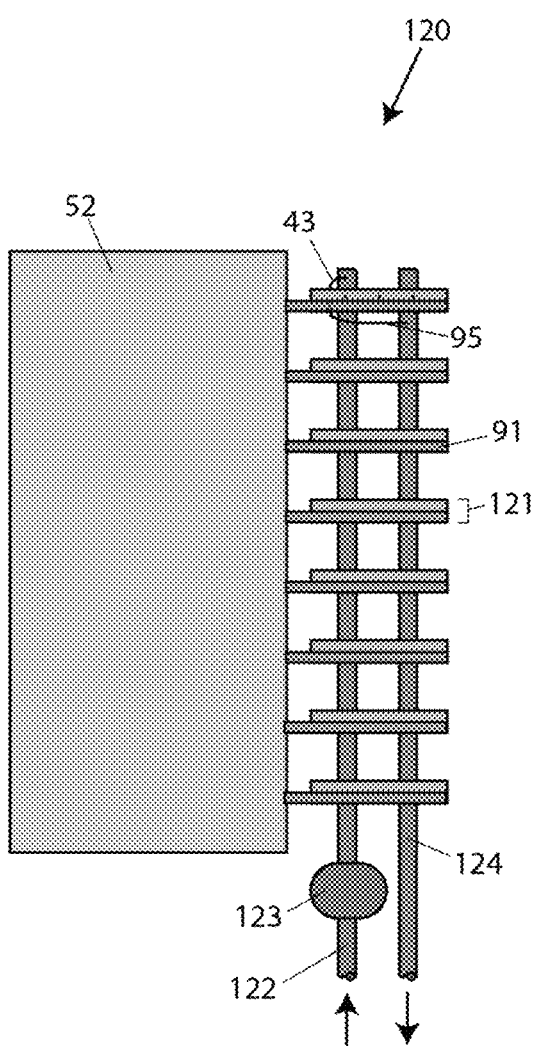
FIG. 12 illustrates a supercomputer layout comprising a linear array of computer pods in an embodiment of the present disclosure.

FIG. 12 illustrates a supercomputer 120 having a linear array of computer pods 121 in an embodiment of the present disclosure. In FIG. 12, power station 52 is shown connected to the linear array of computer pods 121. In FIG. 12, an exemplary server input hose 43 and an exemplary server output hose 95 to connect cooling water to a server 40 in a pod 91 of supercomputer 120 are shown. The water connections to server 40 are illustrated in FIGS. 4 and 9. As shown in FIG. 12, a pod 121 and an upper bus bar 91 are specifically called out. An input conduit 122 configured as a straight pipe carries cooling water into the array of pods 121. Output conduit 124, also configured as a straight pipe, carries cooling water away from the array of pods 121, after heating by the computing elements. A pump 123 for pressurizing the cooling water is shown.

Figure 13:
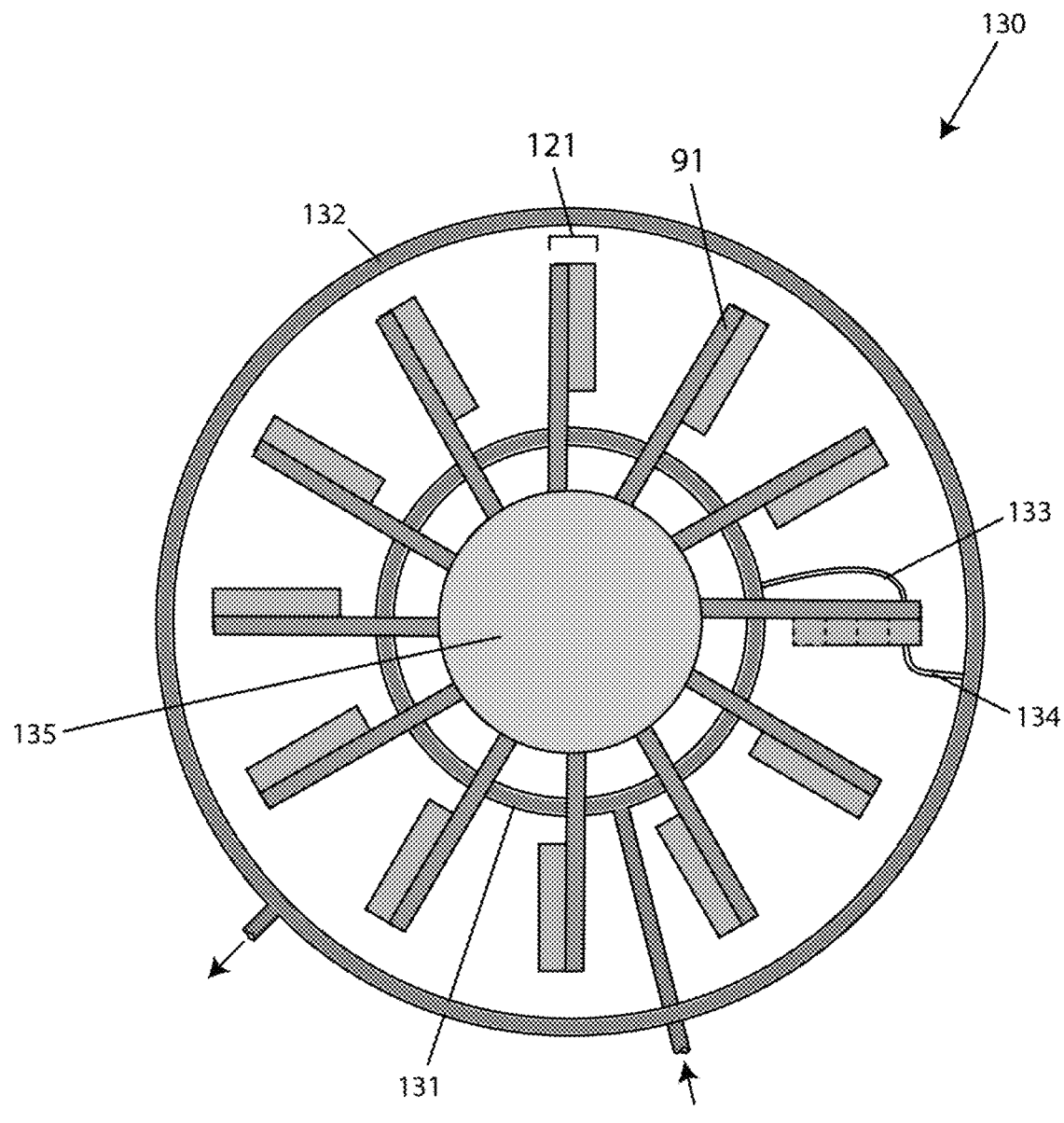
FIG. 13 illustrates a supercomputer layout comprising a circular array of computer pods in an embodiment of the present disclosure.

FIG. 13 illustrates a supercomputer 130 having a circular array of computer pods 121 in an embodiment of the present disclosure. A region 135 for making connections to a power station is shown in the center; the power station may occupy an upper or lower floor. A pod 121 and an upper bus bar 91 are shown. An input conduit 131, configured as a loop, carries cooling water into the array of pods 121. Output conduit 132, also configured as a loop, carries cooling water away from the pod array, after heating by the computing elements. An exemplary server input hose 133 and an exemplary server output hose 134 are shown connected to the input conduit 131, output conduit 132 and to a server 40

(not shown) in pod 121. Input conduit 131 brings cooling water to each server 40, and output conduit 132 carries water heated in each server 40 away to be cooled and recirculated.

Figure 14:
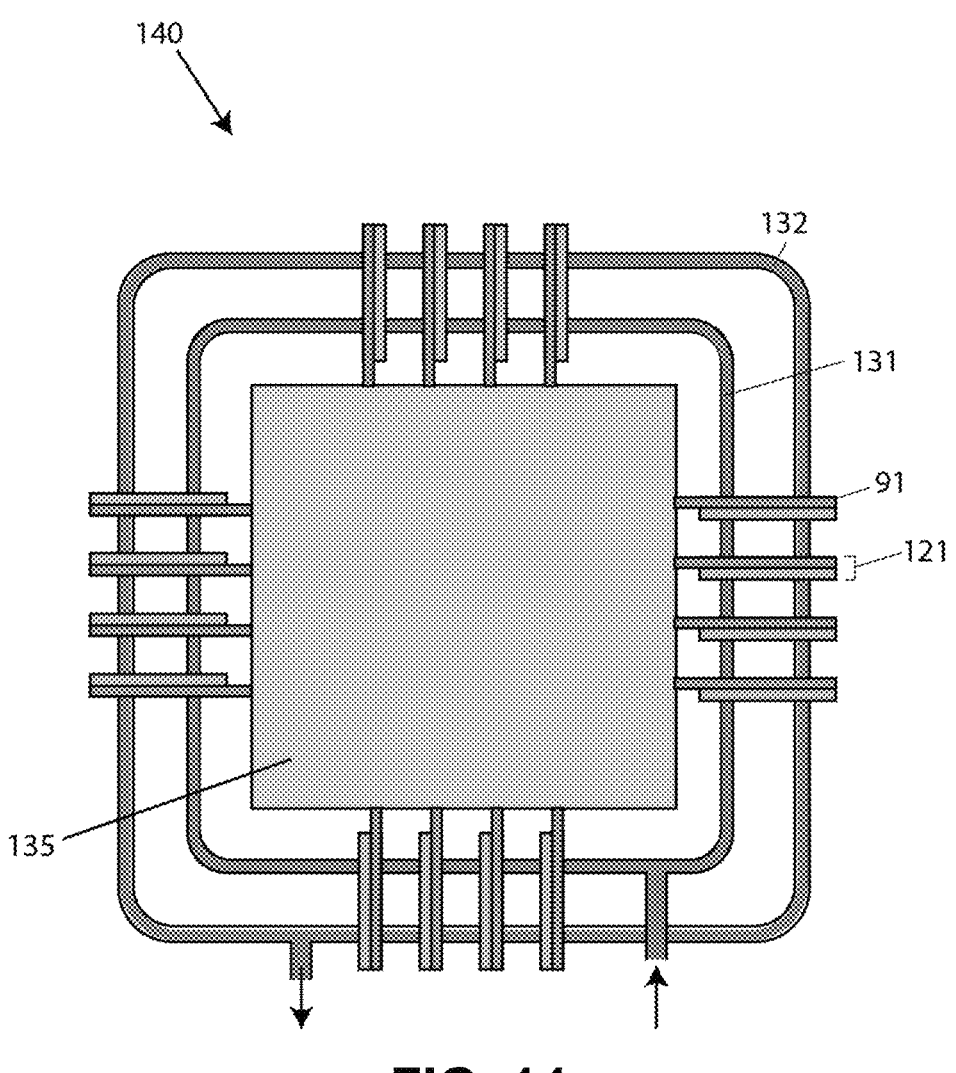
FIG. 14 illustrates a supercomputer layout comprising a square array of computer pods in an embodiment of the present disclosure.

FIG. 14 illustrates a supercomputer 140 having a square array of pods 121 in an embodiment of the present disclosure. A region 135 for making connections to a power station is shown in the center; the power station may occupy an upper or lower floor. A pod 121 and an upper bus bar 91 are shown. An input conduit 131 configured as a loop carries cooling water into the pod array. Output conduit 132, also configured as a loop, carries cooling water away from the pod array, after heating by the computing elements.

Figure 15:
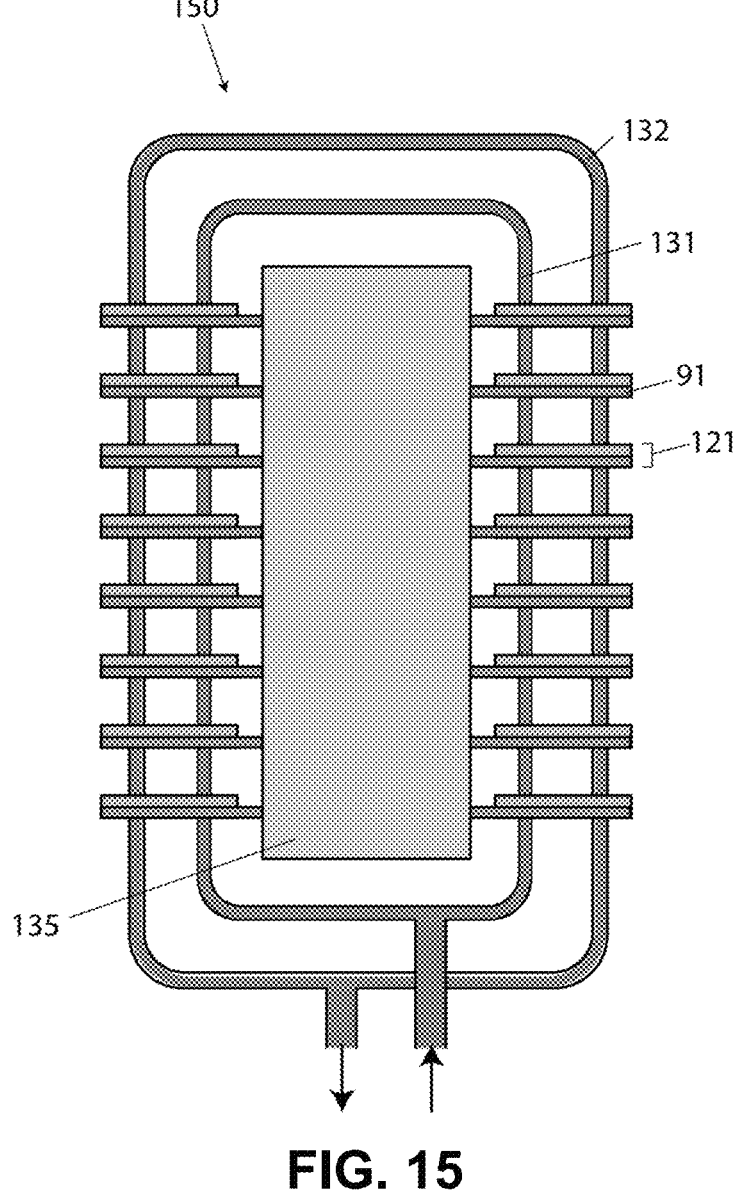
FIG. 15 illustrates a supercomputer layout comprising a rectangular array of computer pods in an embodiment of the present disclosure.

FIG. 15 illustrates a supercomputer 150 having a rectangular array of 16 computer pods 121 in an embodiment of the present disclosure. It will be appreciation that the number of computer pods 121 may be less than or greater than 16. Alternative supercomputer embodiments may have 4-32 computer pods, with a total operating power in the range of 20 megawatts to 10 gigawatts.

In FIG. 15, a region 135 for making connections to a power station is shown in the center; the power station may occupy an upper or lower floor. A computer pod 121 and an upper bus bar 91 are shown. An input conduit 131 configured as a loop carries cooling water into the pod array. Output conduit 132, also configured as a loop, carries cooling water away from the pod array, after heating by the computing elements.

Alterative supercomputer embodiments may have 4-32 computer pods, with a total operating power in the range of 20 megawatts to 10 gigawatts. Each supercomputer configuration may employ multiple copies of the same server, such as server 40, with workload variations handled in software. In an embodiment each computer module 61 within server 40 comprises independently operable tiles, as discussed in reference to FIG. 8, and this leads to operational flexibility. Further control software may be provided in processors mounted on motherboard 65. In an embodiment, the servers are connected via multiple networks including fiber optic networks. Network protocols such as COMPUTE EXPRESS LINK (CXL) may be employed to manage connectivity and latency issues.

To illustrate the power density achievable in supercomputer embodiments described herein, a thermal model is proposed to characterize areal power density in a computer module, such as computer module 61 depicted in FIG. 7. Consider a tile occupying 2,500 mm$^2$ and dissipating 870 W. Selected components include: NVIDIA HOPPER GPU at 350 W and 814 mm$^2$; AMD EPYC 7763 CPU at 280 W and 646 mm$^2$; multiple voltage regulators having a total power of 200 W and a total area of 400 mm$^2$; and miscellaneous sensors and passive devices at 40 W and 54 mm$^2$. Interconnection streets of varying width up to 5 mm are provided around each chip. This computes to an areal power density of 0.35 W/mm$^2$. GPUs and CPUs such as those listed above typically include multiple cores plus integrated high bandwidth memories (HBMs) and interconnect fabric such as COMPUTE EXPRESS LINK (CXL). Consider that the thermal model applies across an active substrate area on hi-res substrate 66 of 18 in×3.35 in or 38,891 mm$^2$ per side, 77,782 mm$^2$ per substrate and per computer module. Module power=77,782 mm 2×0.35 W/mm 2=27.2 kW. From FIG. 6 there are 90 computer modules per server, for a total power of 2.45 MW per server. The server power density is 2,450,000 W/2,907 in$^3$=843 W/in$^3$. The power density in densely-packed section 41 of server 40 is approximately 1,660 W/in$^3$. As explained in relation to FIG. 5, in one embodiment, the computer pod has 4 columns and 15 rows of servers resulting in a power per pod of 60×2.45=147 MW. In this embodiment the flow rate of cooling water per server is 300 gpm for a $\Delta T_1$ of 31° C., using the mass flow rate calculation, $\Delta T=q/(m_{dot}*C_p)$, where $\Delta T_1$ is the temperature rise in ° C., q is the dissipated power in watts, $m_{dot}$ is the mass flow rate in gm/sec, and $C_p$ is the specific heat of water (4.186 J/gm° C.). The flow rate in the input and output water hoses, 43 and 95, is around 31 ft/sec using an internal hose diameter of 2 inches. The flow rate through server 40 is approximately 30 in/sec.

Figure 16:
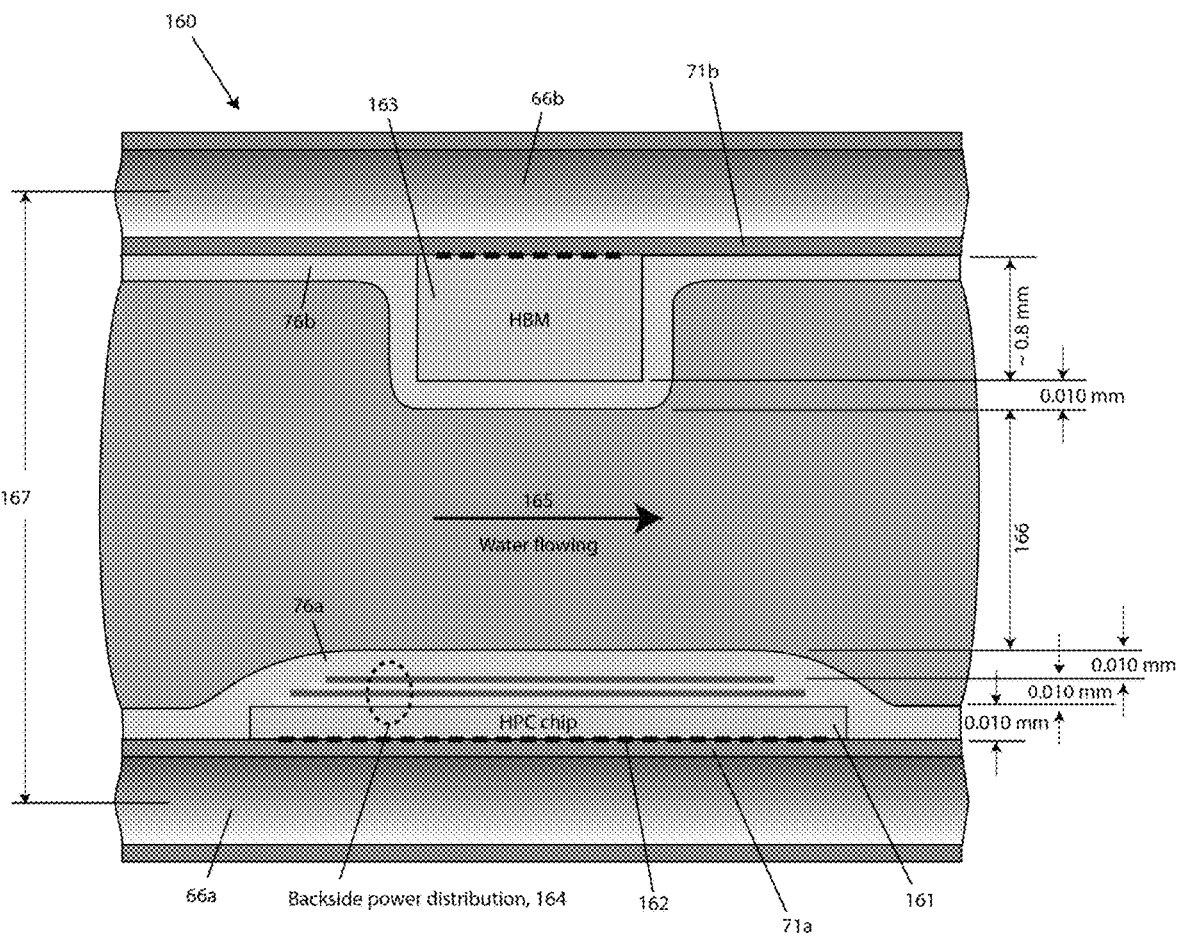
FIG. 16 illustrates thermal paths having low thermal resistance for high and low-powered chips in an embodiment of the present disclosure.

To illustrate the available cooling power in embodiments of the present disclosure, FIG. 16 depicts a 700 W HOPPER chip, NVIDIA H100 SXM 161, mounted on a first hi-res substrate 66a at RDLs 71a. A low power high bandwidth memory (HBM) chip is mounted on a second hi-res substrate 66b at RDLs 71b. Elements in one thermal path include hi-res substrate 66a, RDLs 71a, backside power distribution layers 164, water-impermeable coating 76a, and flowing water 165. Approximate dimensions are illustrated in FIG. 16 to support the thermal analysis discussed herein but the dimensions are not limited to those illustrated in FIG. 16.

In FIG. 16, flip chip bonding connections 162 are also shown. In an embodiment these bonds comprise microbumps which include a solder material. In another embodiment these bonds comprise metal-to-metal hybrid bonds that do not include solder and are formed at an intimate surface connection between termination points at the front face of a semiconductor chip and corresponding termination points at the face of a substrate. This bonding process may be described as direct bond interconnect. Copper-to-copper bonds or other metal-to-metal bonds may be used. Microbumps are compatible with low-temperature processing using organic substrates and low-temperature plasma processing. For example, using organic circuit boards having a high glass transition temperature, Tg, the substrate and mounted chips may be exposed to temperatures as high as 150° C. Hybrid bonds are more compatible with high-temperature CVD processing, in which case a substrate material such as quartz or glass or silicon or silicon nitride or another ceramic material may be employed, and wherein the processing temperature may be as high as 600° C. for example.

FIG. 17 is a table showing heat path contributions for each of the elements in the primary thermal path for cooling the high-performance computing (HPC) chip 161. Exemplary materials and thicknesses are used for the backside power distribution layers 164 and for the water-impermeable coating 76a. A is the area of an element in the heat path, t is the corresponding thickness, P is the power flowing through the element, 6th is the thermal conductivity, θ is the thermal resistance, and $\Delta T_2$ is the temperature difference across the element. If the water inlet temperature is 10° C. then a $\Delta T_1$ of 31° C. results in a water outlet temperature of 41° C. Adding the temperature rise along the short thermal path from water to chip junction, as depicted in FIG. 16 and FIG. 17, adds $\Delta T_2$=9° C. for a total junction temperature of approximately 50° C. This junction temperature is substantially lower than is customary in high-powered assemblies and leads to a system having high performance and high reliability, and this is achieved without any special individual packages or heat sinks. The value of $\Delta T_1$ may be traded off against the volume of cooling water required. For example, doubling $\Delta T_1$ to 62° C. while retaining an inlet temperature of 10° C. and a $\Delta T_2$ of 9° C. will reduce the required amount of cooling water by around 44% and result in a junction temperature of 81° C. This tradeoff will be possible if the water-cooling operation can tolerate a temperature range of 62° C. in this example. In an embodiment, such a temperature range may be enabled by the combined use of an evaporative water-cooling tower and auxiliary chillers. In a further embodiment, run-off from a snow-fed river may be used at the water inlet, wherein the heated output water is used for another purpose such as the heating of buildings.

FIG. 18 is a table summarizing attributes and performances of the Summit and Frontier supercomputers compared against two embodiments of the present disclosure. The first embodiment is illustrated in FIG. 11 wherein 4 rows of a 4-column computer pod are employed to achieve a supercomputer with a power rating of 39 MW, comparable with the Summit supercomputer. The compaction factor described herein, evidenced by over 100X improvement in power density, enables the proposed embodiments to achieve substantial performance improvements over the Summit and Frontier supercomputers, while requiring many fewer server nodes and reduced amounts of cooling water. The energy efficiency in a proposed supercomputer can approach 510 gigaflops/watt, compared with 52.2 gigaflops/watt achieved in the Frontier supercomputer. Water usage can approach 42 petaflops/gpm versus 0.25 petaflops/gpm for Frontier. The second embodiment is illustrated in FIG. 15, with a supercomputer comprising 16 pods 121, each pod comprising 60 servers 40 as in FIG. 5, providing substantial improvements in power rating and cooling efficiency while also providing zettaflop performance.

FIG. 19 is a flow chart of a method for building and operating a supercomputer in an embodiment of the present disclosure. The method comprises the steps of: providing a plurality of servers, step 191; providing a water delivery system operable to deliver cooling water to each server of the plurality of servers, step 192; providing an electric power delivery system operable to deliver electric power to each server of the plurality of servers, step 193; flowing cooling water through each server of the plurality of servers at a rate of 20-500 gallons per minute, step 194; delivering electric power to each server of the plurality of servers at a rate of 500 kW-10 MW, step 195; interconnecting each server of the plurality of servers using electrical and optical networks, step 196; and, executing instructions contained in memory in each server of the plurality of servers to achieve a supercomputer performance in the range of 10 exaflops-10 zettaflops, step 197.

As will be understood by those familiar with the art, the invention may be embodied in other specific forms without departing from the spirit or essential characteristics thereof. Likewise, the particular naming and division of the members, features, attributes, and other aspects are not mandatory or significant, and the mechanisms that implement the invention or its features may have different structural construct, names, and divisions. Accordingly, the disclosure of the invention is intended to be illustrative, but not limiting, of the scope of the invention.

While the invention has been described in terms of several embodiments, those of ordinary skill in the art will recognize that the invention is not limited to the embodiments described but can be practiced with modification and alteration within the spirit and scope of the appended claims. Another embodiment may comprise a computer module having a greater or lesser number of substrate mounting surfaces for example. Other embodiments may have different overall sizes and form factors for the computer module 41 and the water-cooled server 30. The description is thus to be regarded as illustrative instead of limiting. There are numerous other variations to different aspects of the invention described above, which in the interest of conciseness have not been provided in detail. Accordingly, other embodiments are within the scope of the claims.

The invention has been described in relation to particular examples, which are intended in all respects to be illustrative rather than restrictive. Those skilled in the art will appreciate that many different combinations will be suitable for practicing the present invention. For example, the teachings may be applied to other water-cooled electronic systems, especially those with space limitations or aggressive cooling requirements. Other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

The invention claimed is:

1. A supercomputer comprising:

at least one computer pod comprising an array of servers, the array of servers comprising 10-200 servers, each server in the array of servers comprising:

a tank in which cooling water is capable of flowing; and a plurality of computer modules in the tank, each of the plurality of computer modules including a conformable water-impermeable coating that coats the entire module except for an opening at the top, wherein the water-impermeable coating of each of the plurality of computer modules comprises plasma-activated covalent bonds between a layer of the coating and the underlying respective computer module.

2. The supercomputer of claim 1 wherein each computer module comprises a substrate with semiconductor chips mounted thereon, wherein the semiconductor chips are selected from the group consisting of bare die, stacked devices, surface mount devices, and low-profile packaged devices.

3. The supercomputer of claim 2 wherein the semiconductor chips are selected from the group consisting of digital devices, processors, memories, analog devices, radio frequency (RF) devices, optical devices, sensors, passive devices, power conversion devices, voltage regulators and current regulators.

4. The supercomputer of claim 1 further comprising:

a motherboard; and input/output connectors coupled to the motherboard, the input/output connectors comprising electrical and optical connectors.

5. The supercomputer of claim 1 further comprising a set of copper bus bars carrying power from a power station to the at least one computer pod, wherein the copper bus bars carry power in a range of 4-180 MW to each of the at least one computer pod.

6. The supercomputer of claim 5 wherein the copper bus bars carry DC power to each of the at least one computer pod at a voltage in a range of 100-1200 volts and a current in a range of 4,000-100,000 amperes.

7. The supercomputer of claim 1 wherein each server comprises a hose input and a hose output.

8. The supercomputer of claim 7 wherein each of the hose input and the hose output are sized to carry cooling water at a rate of 20-500 gallons per minute.

9. The supercomputer of claim 1 wherein each computer pod is configurable with an adjustable number of columns and an adjustable number of rows.

10. The supercomputer of claim 1 wherein the at least one computer pod comprises a single pod arranged in 2-6 columns and 2-16 rows of servers; the single pod operable with a compute power in a range of 4-180 megawatts.

11. The supercomputer of claim 1 wherein the at least one computer pod comprises twelve to eighteen pods, the twelve to eighteen pods operable with a total compute power in a range of 500 megawatts to 10 gigawatts.

12. The supercomputer of claim 1 wherein the at least one computer pod comprises a plurality of computer pods arranged in a circular configuration.

13. The supercomputer of claim 1 wherein the at least one computer pod comprises a plurality of computer pods arranged in a rectangular configuration.

14. The supercomputer of claim 1, wherein each server of the plurality of servers is configured to execute instructions provided in memory to achieve a performance for the supercomputer in the range of 10 exaflops to 10 zettaflops.

15. A supercomputer comprising:

at least one computer pod comprising an array of servers, the array of servers comprising 10-200 servers, each server in the array of servers comprising:

a tank in which cooling water is capable of flowing; and a plurality of computer modules in the tank, each of the plurality of computer modules including a conformable water-impermeable coating that coats the entire module except for an opening at the top, wherein the water-impermeable coating comprises at least one layer of parylene C.

16. A supercomputer comprising:

at least one computer pod comprising an array of servers, each server in the array of servers comprising:

a tank in which cooling water is capable of flowing; and a plurality of computer modules in the tank, each of the plurality of computer modules including a water-impermeable coating that coats the entire module except for an opening at the top, wherein the water-impermeable coating comprises:

a first layer comprising titanium dioxide;

a second adhesion layer comprising a treatment of A-174 SILANE; and a third layer comprising parylene C.

17. The supercomputer of claim 16 wherein the first layer is applied by atomic layer deposition and has a thickness of approximately 20 nanometers, wherein the third layer is applied by chemical vapor deposition and has a thickness of approximately 25 micrometers.

\* \* \* \* \*